United States Patent
Suzuki et al.

(10) Patent No.: US 11,728,082 B2
(45) Date of Patent: Aug. 15, 2023

(54) MAGNETORESISTIVE EFFECT ELEMENT

(71) Applicant: TDK CORPORATION, Tokyo (JP)

(72) Inventors: Tsuyoshi Suzuki, Tokyo (JP); Shinto Ichikawa, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 155 days.

(21) Appl. No.: 17/214,081

(22) Filed: Mar. 26, 2021

(65) Prior Publication Data

US 2021/0304940 A1 Sep. 30, 2021

(30) Foreign Application Priority Data

Mar. 31, 2020 (WO) .................. PCT/JP2020/014736

(51) Int. Cl.
*H01F 10/32* (2006.01)
*G11B 5/39* (2006.01)
*H03H 7/25* (2006.01)

(52) U.S. Cl.
CPC ....... *H01F 10/3254* (2013.01); *G11B 5/3909* (2013.01); *G11B 5/3967* (2013.01); *H03H 7/258* (2013.01)

(58) Field of Classification Search
None
See application file for complete search history.

(56) References Cited

U.S. PATENT DOCUMENTS

| | | | | |
|---|---|---|---|---|
| 11,489,090 B1* | 11/2022 | Atanackovic | ............ | H01S 5/34 |
| 11,522,087 B1* | 12/2022 | Atanackovic | ..... | H01L 21/02483 |
| 11,522,103 B1* | 12/2022 | Atanackovic | ......... | H01L 29/517 |
| 2012/0091548 A1 | 4/2012 | Sukegawa et al. | | |
| 2013/0221461 A1* | 8/2013 | Sukegawa | ............... | H01L 43/10 257/E29.323 |
| 2018/0040815 A1* | 2/2018 | Sasaki | ..................... | H01F 10/26 |
| 2018/0068680 A1* | 3/2018 | Sasaki | ................. | G11B 5/3909 |
| 2018/0068681 A1* | 3/2018 | Sasaki | ................. | G11B 5/3909 |
| 2018/0090671 A1* | 3/2018 | Kato | ...................... | H01L 43/10 |
| 2019/0006074 A1* | 1/2019 | Inubushi | ............. | H03B 15/006 |
| 2019/0019942 A1* | 1/2019 | Nakada | .................... | H01L 43/10 |
| 2020/0035913 A1* | 1/2020 | Ichikawa | ............ | H01F 10/3254 |
| 2020/0044144 A1* | 2/2020 | Sukegawa | ............ | G11B 5/3909 |
| 2021/0028354 A1* | 1/2021 | Sasaki | ................. | G11B 5/3909 |

FOREIGN PATENT DOCUMENTS

| | | |
|---|---|---|
| EP | 3413363 A1 | 12/2018 |
| JP | 2013-149998 A | 8/2013 |
| JP | 5586028 B2 | 9/2014 |
| JP | 2018-056272 A | 4/2018 |
| JP | 2019-021751 A | 2/2019 |
| JP | 2020-017670 A | 1/2020 |
| WO | 2017/135251 A1 | 8/2017 |

\* cited by examiner

*Primary Examiner* — Kevin M Bernatz
(74) *Attorney, Agent, or Firm* — Oliff PLC

(57) ABSTRACT

A magnetoresistive effect element includes: a first ferromagnetic layer; a second ferromagnetic layer; and a non-magnetic layer located between the first ferromagnetic layer and the second ferromagnetic layer, wherein a crystal structure of the non-magnetic layer is a spinel structure, wherein the non-magnetic layer contains Mg, Al, X, and O as elements constituting the spinel structure, and wherein the X is at least one or more elements selected from a group consisting of Ti, Pt, and W.

19 Claims, 10 Drawing Sheets

MAGNETORESISTIVE EFFECT ELEMENT

CROSS-REFERENCE TO RELATED APPLICATION

Priority is claimed on PCT/JP2020/014736, filed Mar. 31, 2020, the content of which is incorporated herein by reference.

BACKGROUND OF THE INVENTION

Field of the Invention

A magnetoresistive effect element is an element of which a resistance value in a lamination direction changes due to a magnetoresistive effect. The magnetoresistive effect element includes two ferromagnetic layers and a non-magnetic layer sandwiched therebetween. The magnetoresistive effect element in which a conductor is used for a non-magnetic layer is referred to as a giant magnetoresistive effect (GMR) element and the magnetoresistive effect element in which an insulating layer (a tunnel barrier layer, a barrier layer) is used for a non-magnetic layer is referred to as a tunneling magnetoresistive effect (TMR) element. The magnetoresistive effect element can be applied to various applications such as magnetic sensors, high frequency components, magnetic heads, and non-volatile random access memory (MRAM).

For example, Japanese Patent No. 5586028 describes a magnetoresistive effect element using $MgAl_2O_4$ having a spinel-type crystal structure as a tunnel barrier layer.

For example, in order to reduce power consumption of a magnetic sensor using the magnetoresistive effect element, an attempt is made to reduce an area resistance (RA) of the magnetoresistive effect element. For example, Japanese Patent Application Laid-Open No. 2018-56272 describes that a barrier height of a tunnel barrier layer is lowered when Al of $MgAl_2O_4$ is replaced with Ga.

However, Ga has a low melting point and is difficult to be a target by itself. Therefore, for example, it is difficult to adjust the composition ratio of Al and Ga in $Mg(Al, Ga)_2O_4$. In addition, the Ga element easily diffuses into other layers. Accordingly, it is possible to decrease the magnetoresistive change rate (MR ratio) of the magnetoresistive effect element and increase the RA thereof.

SUMMARY OF THE INVENTION

The present invention provides the following means in order to solve the above-described problems.

(1) A magnetoresistive effect element according to a first aspect includes: a first ferromagnetic layer; a second ferromagnetic layer; and a non-magnetic layer located between the first ferromagnetic layer and the second ferromagnetic layer, wherein a crystal structure of the non-magnetic layer is a spinel structure, wherein the non-magnetic layer contains Mg, Al, X, and O as elements constituting the spinel structure, and wherein the X is at least one or more elements selected from a group consisting of Ti, Pt, and W.

(2) In the magnetoresistive effect element according to the above-described aspect, the element represented by the X may be located at an A site or a B site of the spinel structure.

(3) In the magnetoresistive effect element according to the above-described aspect, the non-magnetic layer may have a concentration distribution of the X in a lamination direction.

(4) In the magnetoresistive effect element according to the above-described aspect, a concentration of the X of at least one of a first surface on the side of the first ferromagnetic layer in the non-magnetic layer and a second surface on the side opposite to the first surface may be higher than an average concentration of the X of the non-magnetic layer.

(5) In the magnetoresistive effect element according to the above-described aspect, the concentration of the X of both the first surface and the second surface may be higher than the average concentration of the X of the non-magnetic layer.

(6) In the magnetoresistive effect element according to the above-described aspect, the concentration of the X at the center of the non-magnetic layer in the lamination direction may be higher than the average concentration of the X of the non-magnetic layer.

(7) In the magnetoresistive effect element according to the above-described aspect, a crystal structure of the non-magnetic layer may be a reverse spinel structure and a crystal space group may be Mama or $P4_122$.

(8) The magnetoresistive effect element according to the above-described aspect may further include an MgO layer located between the non-magnetic layer and at least one of the first ferromagnetic layer and the second ferromagnetic layer.

(9) The magnetoresistive effect element according to the above-described aspect may further include an Mg—Al—O layer located between the non-magnetic layer and at least one of the first ferromagnetic layer and the second ferromagnetic layer.

(10) In the magnetoresistive effect element according to the above-described aspect, the X may be Ti.

(11) In the magnetoresistive effect element according to the above-described aspect, composition ratios x, y, and z of Mg, Al, and Ti with respect to a total amount of Mg, Al, and Ti of the non-magnetic layer may be in a region surrounded by $1/12 \leq x \leq 11/12$, $0 \leq y \leq 7/12$, and $1/12 \leq z \leq 7/12$ in triangular coordinates using x, y, and z.

(12) In the magnetoresistive effect element according to the above-described aspect, the composition ratios x, y, and z of Mg, Al, and Ti with respect to the total amount of Mg, Al, and Ti of the non-magnetic layer may be in a region excluding a region satisfying $x < 7/12$ and $3/12 < z$ in the region surrounded by $3/12 \leq x \leq 11/12$, $0 \leq y \leq 7/12$, and $1/12 \leq z \leq 5/12$ in the triangular coordinates using x, y, and z.

(13) In the magnetoresistive effect element according to the above-described aspect, the X may be Pt, and composition ratios x, y, and z of Mg, Al, and Pt with respect to a total amount of Mg, Al, and Pt of the non-magnetic layer may be in a region surrounded by $1/12 \leq x \leq 11/12$, $0 \leq y \leq 7/12$, and $1/12 \leq z \leq 9/12$ in triangular coordinates using x, y, and z.

(14) In the magnetoresistive effect element according to the above-described aspect, the X may be Pt and the composition ratios x, y, and z of Mg, Al, and Pt with respect to the total amount of Mg, Al, and Pt of the non-magnetic layer may be in a region surrounded by a region excluding a region satisfying $y < 3/12$ and $5/12 < x$ in the region surrounded by $1/12 \leq x \leq 11/12$, $0 \leq y \leq 7/12$, and $1/12 \leq z \leq 9/12$ in the triangular coordinates using x, y, and z.

(15) In the magnetoresistive effect element according to the above-described aspect, the X may be W.

(16) In the magnetoresistive effect element according to the above-described aspect, composition ratios x, y, and z of Mg, Al, and W with respect to a total amount of Mg, Al, and W of the non-magnetic layer may be in a region surrounded by $1/12 \leq x \leq 11/12$, $0 \leq y \leq 9/12$, and $1/12 \leq z \leq 5/12$ in triangular coordinates using x, y, and z.

DETAILED DESCRIPTION OF THE INVENTION

Figure 1:
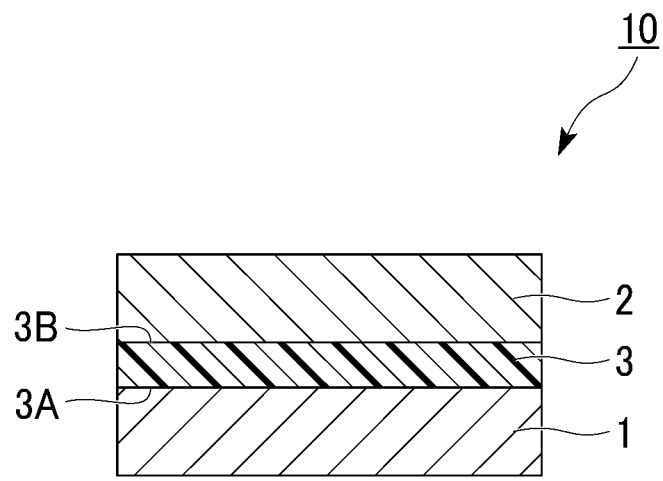
FIG. 1 is a cross-sectional view of a magnetoresistive effect element according to a first embodiment.

Hereinafter, this embodiment will be described in detail by appropriately referring to the drawings. In the drawings used in the following description, the featured parts may be enlarged for convenience and the dimensional ratios of each component may differ from the actual ones in order to make the features of this embodiment easy to understand. The materials, dimensions, and the like exemplified in the following description are examples and the present invention is not limited thereto. Then, the present invention can be appropriately modified without changing the gist thereof.

First Embodiment

FIG. 1 is a cross-sectional view of a magnetoresistive effect element according to a first embodiment. First, directions will be defined. A direction in which each layer is laminated may be referred to as a lamination direction. Further, a direction that intersects the lamination direction and spreads each layer may be referred to as an in-surface direction.

A magnetoresistive effect element 10 shown in FIG. 1 includes a first ferromagnetic layer 1, a second ferromagnetic layer 2, and a non-magnetic layer 3. The non-magnetic layer 3 is between the first ferromagnetic layer 1 and the second ferromagnetic layer 2.

The magnetoresistive effect element 10 outputs a change in relative angle between the magnetization of the first ferromagnetic layer 1 and the magnetization of the second ferromagnetic layer 2 as a change in resistance value. The magnetization of the second ferromagnetic layer 2 is more likely to rotate, for example, than the magnetization of the first ferromagnetic layer 1. When a predetermined external force is applied, the direction of magnetization of the first ferromagnetic layer 1 is not changed (is fixed) and the direction of magnetization of the second ferromagnetic layer 2 is changed. As the direction of magnetization of the second ferromagnetic layer 2 changes with respect to the direction of magnetization of the first ferromagnetic layer 1, the resistance value of the magnetoresistive effect element 10 changes. In this case, the first ferromagnetic layer 1 may be referred to as a magnetization fixed layer and the second ferromagnetic layer 2 may be referred to as a magnetization free layer. Hereinafter, the first ferromagnetic layer 1 is described as the magnetization fixed layer and the second ferromagnetic layer 2 is described as the magnetization free layer. However, this relationship may be reversed.

The difference in the ease of rotation between the magnetization of the first ferromagnetic layer 1 and the magnetization of the second ferromagnetic layer 2 when a predetermined external force is applied is caused by the difference in coercivity between the first ferromagnetic layer 1 and the second ferromagnetic layer 2. For example, if the thickness of the second ferromagnetic layer 2 is set to be thinner than the thickness of the first ferromagnetic layer 1, the coercivity of the second ferromagnetic layer 2 becomes smaller than the coercivity of the first ferromagnetic layer 1. Further, for example, an antiferromagnetic layer may be provided on a surface opposite to the non-magnetic layer 3 in the first ferromagnetic layer 1. In this case, the coercivity of the first ferromagnetic layer 1 becomes large due to the exchange coupling exerted between the first ferromagnetic layer 1 and the antiferromagnetic layer. The antiferromagnetic layer is, for example, IrMn, PtMn, or the like. Further, a spacer layer may be provided on the side of the first ferromagnetic layer 1 and a third ferromagnetic layer may be provided on the side of the antiferromagnetic layer between the first ferromagnetic layer 1 and the antiferromagnetic layer. In this case, the coercivity of the first ferromagnetic layer 1 becomes even larger due to the exchange coupling exerted between the third ferromagnetic layer and the antiferromagnetic layer and the synthetic magnetic coupling exerted between the first ferromagnetic layer 1 and the third ferromagnetic layer through the spacer layer. The spacer layer contains, for example, at least one selected from a group consisting of Ru, Ir, Rh, Re, Cr, Zr, and Cu. The thickness of the space is preferably 0.3 nm or more and 1.0 nm or less.

The first ferromagnetic layer 1 is closer to a substrate than, for example, the second ferromagnetic layer 2. Each layer of the magnetoresistive effect element 10 is laminated on, for example, the substrate. The first ferromagnetic layer 1 which is closer to the substrate is more likely to have higher crystallinity than the second ferromagnetic layer 2 and is more likely to stabilize the magnetization than the second ferromagnetic layer.

The first ferromagnetic layer 1 and the second ferromagnetic layer 2 contain a ferromagnetic material. The first ferromagnetic layer 1 and the second ferromagnetic layer 2, for example, include a metal selected from a group consisting of Cr, Mn, Co, Fe, and Ni, an alloy containing one or more metals selected from the group, or an alloy containing one or more metals selected therefrom and at least one or more elements of B, C, and N as the ferromagnetic material. In particular, Fe or CoFe alloy has high spin polarization and when used for the first ferromagnetic layer 1 or the second ferromagnetic layer 2, the MR ratio of the magnetoresistive effect element 10 can be increased. Specific examples of the first ferromagnetic layer 1 and the second ferromagnetic layer 2 include Co—Fe, Co—Fe—B, Ni—Fe, Co—Ho alloy (CoHo$_2$) and Sm—Fe alloy (SmFe$_{12}$).

The first ferromagnetic layer 1 and the second ferromagnetic layer 2 may be a Heusler alloy. The Heusler alloy has high spin polarization and can realize a high MR ratio. The Heusler alloy contains intermetallic compounds with a chemical composition of XYZ or X$_2$YZ. X is a transition metal element or a noble metal element of a Co, Fe, Ni, or Cu group on the periodic table. Y is a transition metal of a Mn, V, Cr or Ti group and the element species of X can also be selected. Z is a typical element of groups III to V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like can be exemplified. The Heusler alloy has high spin polarization and can increase the MR ratio of the magnetoresistive effect element 10.

When the direction of magnetization of the first ferromagnetic layer 1 and the second ferromagnetic layer 2 is perpendicular to the lamination surface, the thickness is preferably 3 nm or less. The perpendicular magnetic anisotropy is added to the first ferromagnetic layer 1 and the second ferromagnetic layer 2 at the interface with the non-magnetic layer 3. Since the effect of the perpendicular magnetic anisotropy is attenuated by increasing the film thickness of the first ferromagnetic layer 1 and the second ferromagnetic layer 2, it is preferable to decrease the film thickness of the first ferromagnetic layer 1 and the second ferromagnetic layer 2.

The non-magnetic layer 3 may be a conductor, a semiconductor, or an insulator. The non-magnetic layer 3 is, for example, a tunnel barrier layer having an insulating property.

The crystal structure of the non-magnetic layer 3 is a spinel structure. The spinel structure includes a normal spinel structure and a reverse spinel structure. The normal spinel structure is represented by $AB_2O_4$ and the reverse spinel structure is represented by $B(AB)O_4$. The reverse spinel structure is closer to the crystal structure of MgO than the normal spinel structure and can realize a high MR ratio.

The non-magnetic layer 3 contains Mg, Al, X, and O as elements constituting the spinel structure. Here, X is one or more elements selected from a group consisting of Ti, Pt, and W. X is, for example, Ti. X is, for example, Pt. X is, for example, W. X is less likely to diffuse into other layers even during annealing. The element represented by X is, for example, at the A site or B site of the spinel structure. X is replaced with, for example, Mg or Al of Mg—Al—O. Mg—Al—O is, for example, $MgAl_2O_4$.

Figure 2:
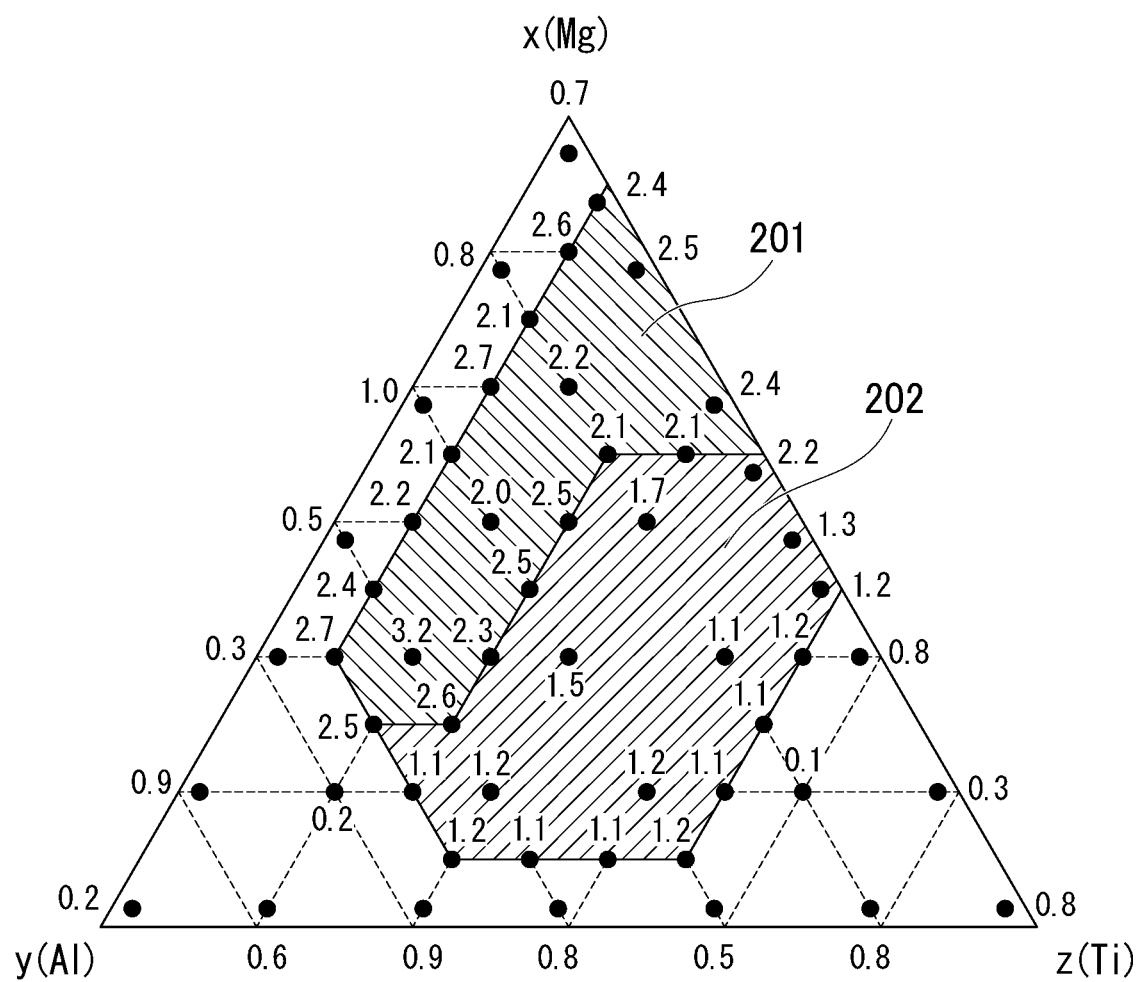
FIG. 2 is a triangular coordinate diagram with x, y, and z as coordinate axes when the composition ratios of Mg, Al, and Ti are x, y, and z (x+y+z=1).

For example, when X is Ti as shown in FIG. 2, x, y, and z are in, for example, a region surrounded by $1/12 \leq x \leq 11/12$, $0 \leq y \leq 7/12$, and $1/12 \leq z \leq 7/12$ in the triangular coordinates with x, y, and z as the coordinate axes on the assumption that the composition ratios of Mg, Al, and Ti to the total amount of Mg, Al, and Ti in the non-magnetic layer 3 are x, y, and z ($x+y+z=1$). Further, for example, x, y, and z are in a region excluding a region satisfying $x<7/12$ and $3/12<z$ in the region surrounded by $3/12 \leq x \leq 11/12$, $0 \leq y \leq 7/12$, and $1/12 \leq z \leq 5/12$. The composition of oxygen O is not limited to 1 as long as the spinel structure is not disrupted.

Figure 3:
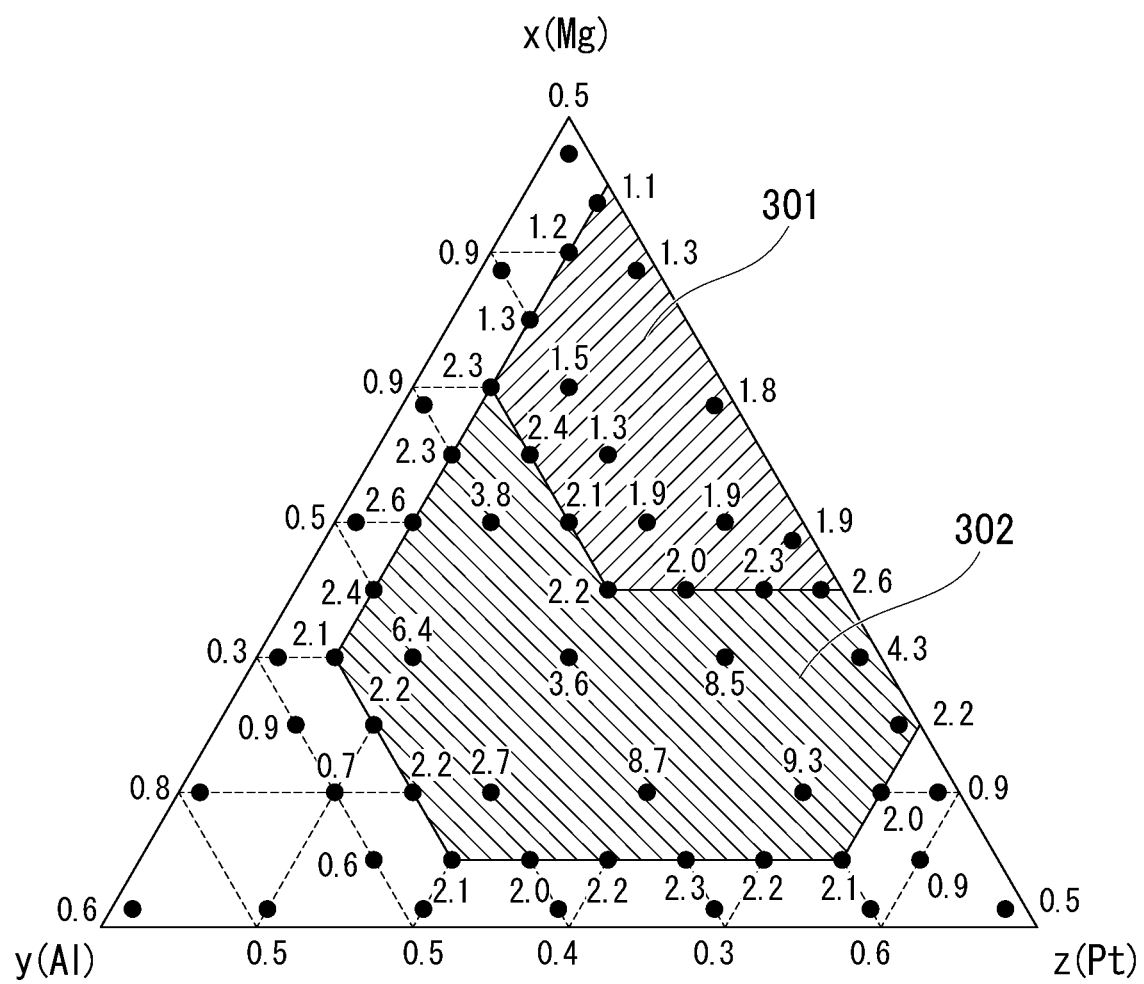
FIG. 3 is a triangular coordinate diagram with x, y, and z as coordinate axes when the composition ratios of Mg, Al, and Pt are x, y, and z (x+y+z=1).

For example, when X is Pt as shown in FIG. 3, x, y, and z are in, for example, a region surrounded by $1/12 \leq x \leq 11/12$, $0 \leq y \leq 7/12$, and $1/12 \leq z \leq 9/12$ in the triangular coordinates with x, y, and z as the coordinate axes on the assumption that the composition ratios of Mg, Al, and Ti to the total amount of Mg, Al, and Pt in the non-magnetic layer 3 are x, y, and z ($x+y+z=1$). Further, for example, x, y, and z are in a region excluding a region satisfying $y<3/12$ and $5/12<x$ in the region surrounded by $1/12 \leq x \leq 11/12$, $0 \leq y \leq 7/12$, and $1/12 \leq z \leq 9/12$. The composition of oxygen O is not limited to 1 as long as the spinel structure is not disrupted.

Figure 4:
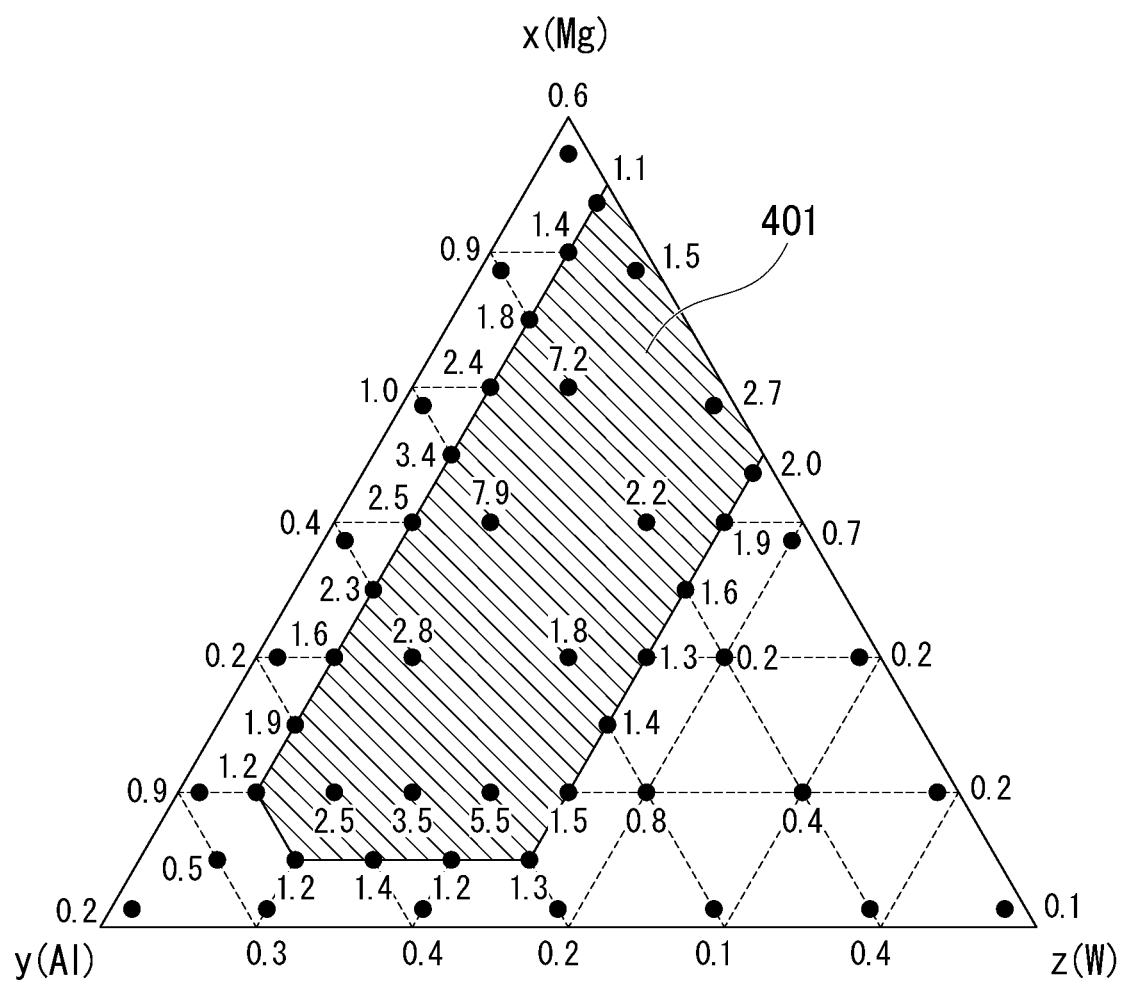
FIG. 4 is a triangular coordinate diagram with x, y, and z as coordinate axes when the composition ratios of Mg, Al, and W are x, y, and z (x+y+z=1).

For example, when X is W as shown in FIG. 4, x, y, and z are in, for example, a region surrounded by $1/12 \leq x \leq 11/12$, $0 \leq y \leq 9/12$, and $1/12 \leq z \leq 5/12$ in the triangular coordinates with x, y, and z as the coordinate axes on the assumption that the composition ratios of Mg, Al, and W to the total amount of Mg, Al, and W in the non-magnetic layer 3 are x, y, and z ($x+y+z=1$). The composition of oxygen O is not limited to 1 as long as the spinel structure is not disrupted.

The space group of the crystals of the non-magnetic layer 3 is, for example, Imma or $P4_122$. Imma and $P4_122$ have high crystal symmetry. When the non-magnetic layer 3 has these space groups, the RA of the magnetoresistive effect element 10 decreases and the MR ratio increases.

The non-magnetic layer 3 has, for example, a distribution of the element concentration of X in the lamination direction. Oxygen elements are attracted to a portion where the element concentration of X is high and the RA of the non-magnetic layer 3 decreases.

For example, the concentration of the X on at least one of a first surface 3A and a second surface 3B is higher than the average concentration of X in the non-magnetic layer 3. The concentration of the X of the first surface 3A and the second surface 3B may be higher than, for example, the average concentration of X in the non-magnetic layer 3. The first surface 3A is a surface on the side of the first ferromagnetic layer 1 in the non-magnetic layer 3. The second surface 3B is a surface on the side opposite to the first surface 3A and is a surface on the side of the second ferromagnetic layer 2.

When the concentration of the X of the first surface 3A or the second surface 3B becomes higher, the band folding effect is suppressed. The band folding effect occurs at the interface between layers with different grid spacing. Since the band folding effect causes an additional conductive path, the MR ratio of the magnetoresistive effect element 10 decreases.

The non-magnetic layer 3 may be produced by forming a film using a target made of an oxide or may be produced by oxidizing the alloy during or after the film formation.

Further, for example, the concentration of the X at the center of the non-magnetic layer 3 in the lamination direction may be higher than the average concentration of X of the non-magnetic layer 3. When the concentration of the X at the center of the non-magnetic layer 3 in the lamination direction is high, oxygen elements are attracted toward a center portion of a metal layer, which becomes the non-magnetic layer 3, at the time of production. As a result, the first ferromagnetic layer 1 and the second ferromagnetic layer 2 are suppressed from being oxidized at the time of production and the RA of the magnetoresistive effect element decreases.

The composition analysis of each layer constituting the magnetoresistive effect element 10 can be performed using energy dispersive X-ray analysis (EDS). Further, when the EDS ray analysis is performed, for example, the composition distribution of each material in the film thickness direction can be confirmed.

The magnetoresistive effect element 10 can be obtained by sequentially laminating each layer. Further, X has a high single melting point. For example, Ga has a melting point of 30° C., but Ti has a melting point of 1668° C., Pt has a melting point of 1768° C., and W has a melting point of 3422° C. Therefore, a single target of X can be used and the composition ratio of the non-magnetic layer 3 can be easily adjusted.

In the magnetoresistive effect element 10 according to this embodiment, since the non-magnetic layer 3 contains the X element, the barrier height of the non-magnetic layer 3 decreases. When the barrier height of the non-magnetic layer 3 decreases, the RA of the magnetoresistive effect element 10 decreases. Further, since the non-magnetic layer 3 contains the X element, the lattice consistency with the first ferromagnetic layer 1 and the second ferromagnetic layer 2 becomes higher than when MgO is used for the non-magnetic layer 3 and hence the MR ratio of the magnetoresistive effect element 10 is improved.

Although the embodiments of the present invention have been described with reference to the drawings, the configurations of each embodiment and a combination thereof are examples and the configurations can be added, omitted, replaced, and modified into other forms in the scope not departing from the gist of the present invention.

For example, the magnetoresistive effect element 10 may include a layer other than the first ferromagnetic layer 1, the second ferromagnetic layer 2, and the non-magnetic layer 3.

First Modified Example

Figure 5:
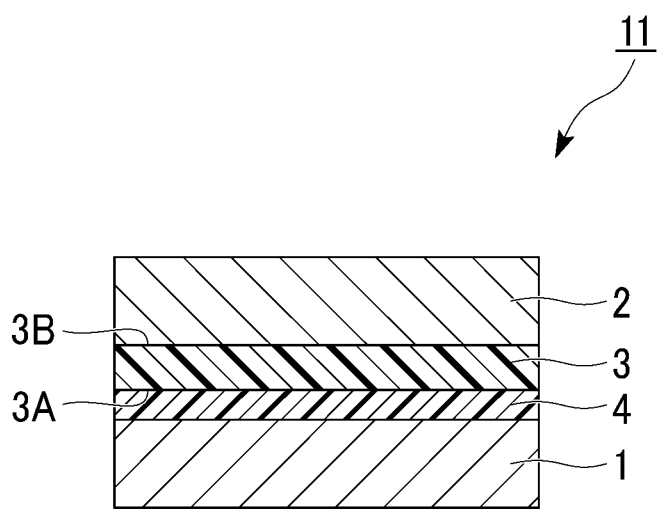
FIG. 5 is a cross-sectional view of a magnetoresistive effect element according to a first modified example.

FIG. 5 is a cross-sectional view of a magnetoresistive effect element 11 according to a first modified example. The magnetoresistive effect element 11 shown in FIG. 5 is different from the magnetoresistive effect element 10 shown in FIG. 1 in that an MgO layer 4 is further provided between the first ferromagnetic layer 1 and the non-magnetic layer 3. In the first modified example, the same reference numerals will be given to the same configurations as those of the magnetoresistive effect element 10 shown in the first embodiment and the description thereof will be omitted.

The MgO layer 4 is located between the first ferromagnetic layer 1 and the non-magnetic layer 3. The MgO layer 4 is in contact with, for example, the first ferromagnetic layer 1. MgO has high crystal self-orientation and the MgO layer 4 crystallizes even at a low temperature. The crystallized MgO layer 4 promotes the crystallization of adjacent layers. The MgO layer 4 shown in FIG. 5 promotes the crystallization of the first ferromagnetic layer 1 and the non-magnetic layer 3. When the crystallinity of each layer of the magnetoresistive effect element 11 increases, the MR ratio of the magnetoresistive effect element 11 increases and the RA thereof decreases.

Further, FIG. 5 shows an example in which the MgO layer 4 is located between the first ferromagnetic layer 1 and the non-magnetic layer 3, but the MgO layer 4 may be located between the second ferromagnetic layer 2 and the non-magnetic layer 3 or may be located between the first ferromagnetic layer 1 and the non-magnetic layer 3 and between the second ferromagnetic layer 2 and the non-magnetic layer 3 at the same time.

Second Modified Example

Figure 6:
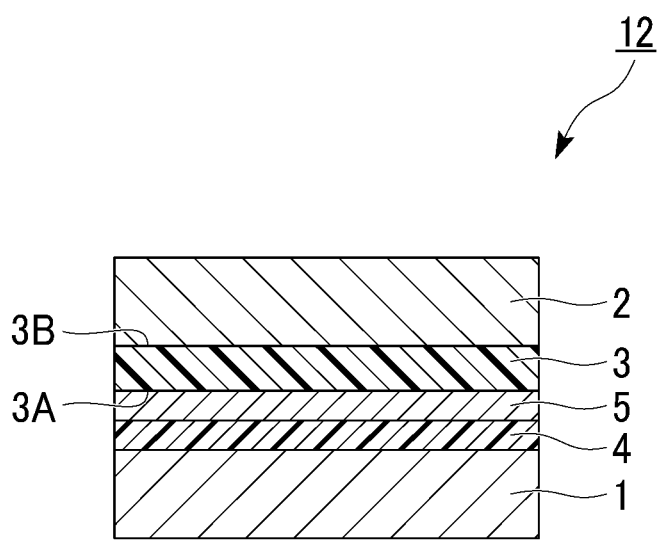
FIG. 6 is a cross-sectional view of a magnetoresistive effect element according to a second modified example.

FIG. 6 is a cross-sectional view of a magnetoresistive effect element 12 according to a second modified example. The magnetoresistive effect element 12 shown in FIG. 6 is different from the magnetoresistive effect element 11 shown in FIG. 5 in that the Mg—Al—O layer 5 is further provided between the first ferromagnetic layer 1 and the non-magnetic layer 3. In the second modified example, the same reference numerals will be given to the same configurations as those of the magnetoresistive effect element 11 shown in the first modified example and the description thereof will be omitted.

The Mg—Al—O layer 5 is located between the first ferromagnetic layer 1 and the non-magnetic layer 3. The Mg—Al—O layer 5 is located, for example, between the non-magnetic layer 3 and the MgO layer 4. The Mg—Al—O layer 5 is an oxide of Mg and Al and is, for example, $MgAl_2O_4$.

$MgAl_2O_4$ has higher lattice consistency with the ferromagnetic layer than MgO. It is possible to reduce the lattice mismatch between the first ferromagnetic layer 1 and the non-magnetic layer 3 by inserting the Mg—Al—O layer 5 between the MgO layer 4 and the first ferromagnetic layer 1. When the lattice consistency of each layer increases, the RA of the magnetoresistive effect element 12 decreases.

Further, FIG. 6 shows an example in which the Mg—Al—O layer 5 is located on the side of the first ferromagnetic layer 1 in the non-magnetic layer 3, but the Mg—Al—O layer 5 may be located on the side of the second ferromagnetic layer 2 in the non-magnetic layer 3.

The magnetoresistive effect elements 10, 11, and 12 can be used for various purposes. The magnetoresistive effect elements 10, 11, and 12 can be applied to, for example, magnetic heads, magnetic sensors, magnetic memories, high frequency filters, and the like.

Next, application examples of the magnetoresistive effect element according to this embodiment will be described. Additionally, in the application examples below, the magnetoresistive effect element 10 is used as the magnetoresistive effect element, but the magnetoresistive effect element is not limited thereto.

Figure 7:
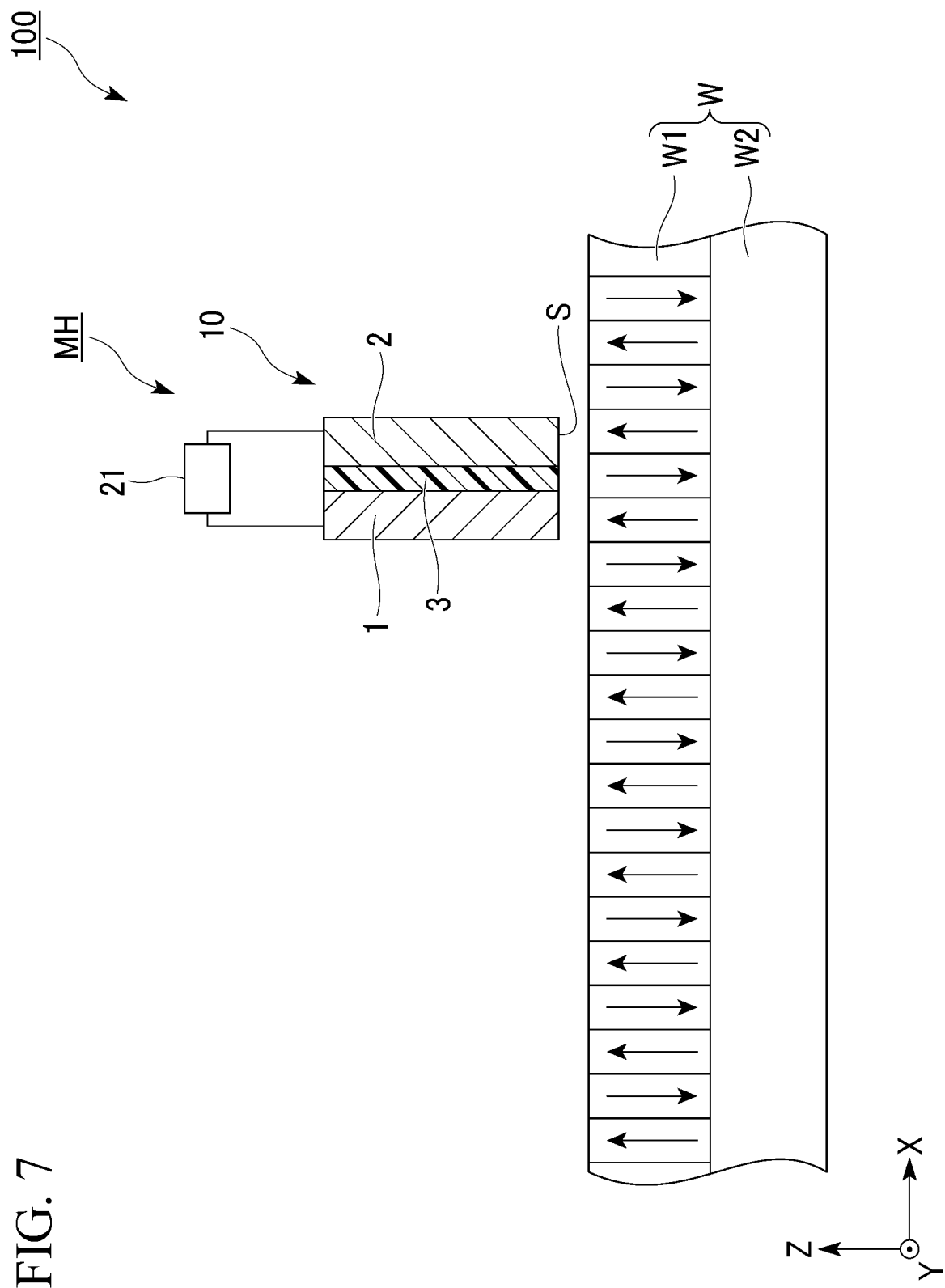
FIG. 7 is a cross-sectional view of a magnetic recording element according to Application Example 1.

FIG. 7 is a cross-sectional view of a magnetic recording element 100 according to Application Example 1. FIG. 7 is a cross-sectional view in which the magnetic recording element 100 is cut along the lamination direction.

As shown in FIG. 7, the magnetic recording element 100 includes a magnetic head MH and a magnetic recording medium W. In FIG. 7, one direction in which the magnetic recording medium W extends is the X direction and a direction perpendicular to the X direction is the Y direction. An XY plane is parallel to the main surface of the magnetic recording medium W. A direction connecting the magnetic recording medium W and the magnetic head MH and perpendicular to the XY plane is the Z direction.

An air bearing surface S of the magnetic head MH faces the surface of the magnetic recording medium W. The magnetic head MH moves in the directions of an arrow +X and an arrow −X along the surface of the magnetic recording medium W at a position separated from the magnetic recording medium W by a certain distance. The magnetic head MH includes the magnetoresistive effect element 10 which acts as a magnetic sensor and a magnetic recording unit (not shown). The resistance measuring instrument 21 measures the resistance value of the magnetoresistive effect element 10 in the lamination direction.

The magnetic recording unit applies a magnetic field to a recording layer W1 of the magnetic recording medium W to determine the direction of magnetization of the recording layer W1. That is, the magnetic recording unit records magnetically on the magnetic recording medium W. The magnetoresistive effect element 10 reads the information of magnetization of the recording layer W1 written by the magnetic recording unit.

The magnetic recording medium W includes the recording layer W1 and a backing layer W2. The recording layer W1 is a portion for performing magnetic recording and the backing layer W2 is a magnetic path (magnetic flux passage) for returning the magnetic flux for writing to the magnetic head MH again. The recording layer W1 records the magnetic information as the direction of magnetization.

The second ferromagnetic layer 2 of the magnetoresistive effect element 10 is, for example, a magnetization free layer. Therefore, the second ferromagnetic layer 2 exposed to the air bearing surface S is influenced by the magnetization recorded on the recording layer W1 of the facing magnetic recording medium W. For example, in FIG. 5, the direction of magnetization of the second ferromagnetic layer 2 faces the +z direction due to the magnetization facing the +z direction of the recording layer W1. In this case, the directions of magnetization of the first ferromagnetic layer 1 and the second ferromagnetic layer 2 which are the magnetization fixed layers are parallel.

Here, the resistance in the case in which the directions of magnetization of the first ferromagnetic layer 1 and the second ferromagnetic layer 2 are parallel is different from the resistance in the case in which the directions of magnetization of the first ferromagnetic layer 1 and the second ferromagnetic layer 2 are antiparallel. The MR ratio of the magnetoresistive effect element 10 becomes larger as the difference between the resistance value in the parallel case and the resistance value in the antiparallel case becomes larger. In the magnetoresistive effect element 10 according to this embodiment, the RA is low and the power consumption is low.

The shape of the magnetoresistive effect element 10 of the magnetic head MH is not particularly limited. For example, the first ferromagnetic layer 1 may be installed at a position away from the magnetic recording medium W in order to avoid the influence of the leakage magnetic field of the magnetic recording medium W on the first ferromagnetic layer 1 of the magnetoresistive effect element 10.

Figure 8:
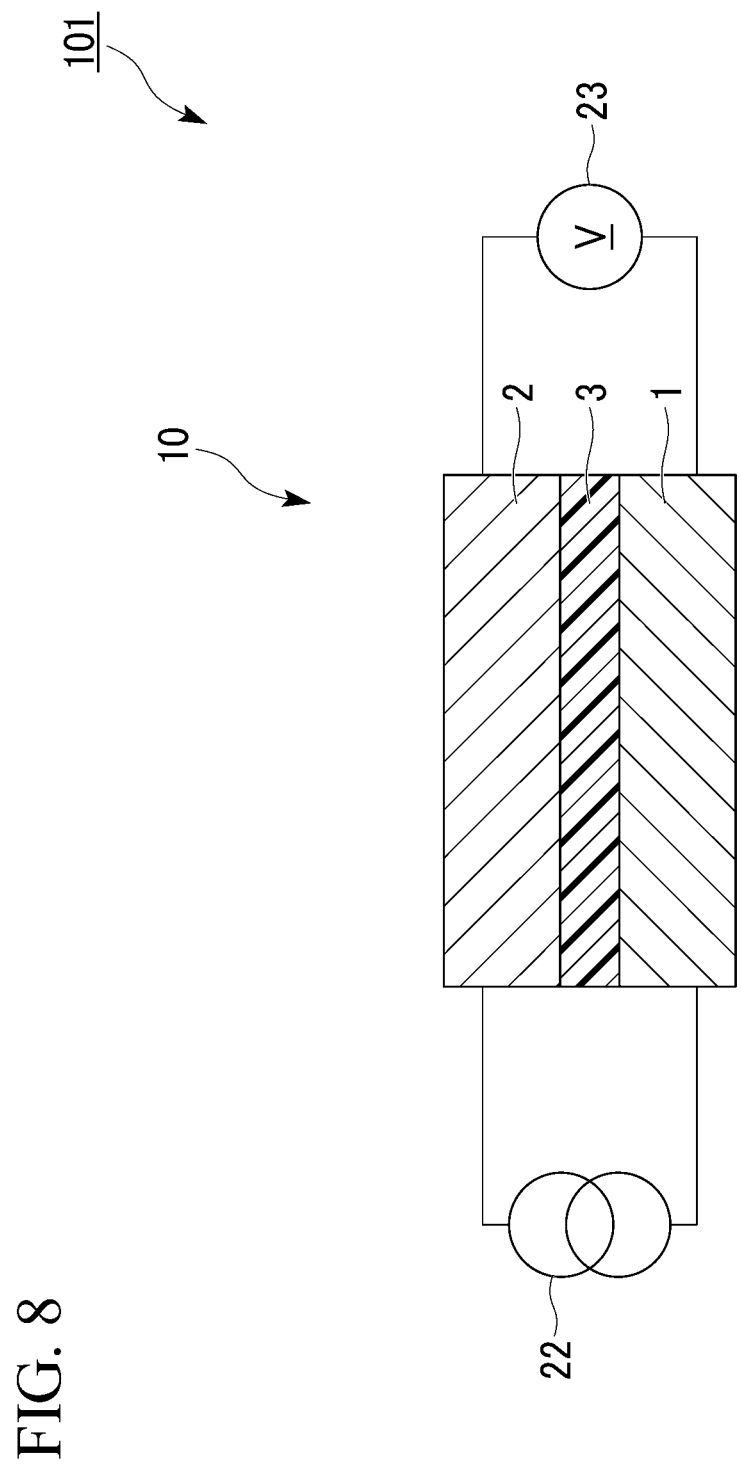
FIG. 8 is a cross-sectional view of a magnetic recording element according to Application Example 2.

FIG. 8 is a cross-sectional view of a magnetic recording element 101 according to Application Example 2. FIG. 8 is a cross-sectional view in which the magnetic recording element 101 is cut along the lamination direction.

As shown in FIG. 8, the magnetic recording element 101 includes the magnetoresistive effect element 10, a power supply 22, and a measurement unit 23. The power supply 22 gives a potential difference in the lamination direction of the magnetoresistive effect element 10. The power supply 22 is, for example, a DC power supply. The measurement unit 23 measures a resistance value of the magnetoresistive effect element 10 in the lamination direction.

When a potential difference is generated between the first ferromagnetic layer 1 and the second ferromagnetic layer 2 by the power supply 22, a current flows in the lamination direction of the magnetoresistive effect element 10. The current is spin-polarized when passing through the first ferromagnetic layer 1 and becomes a spin-polarized current. The spin-polarized current reaches the second ferromagnetic layer 2 through the non-magnetic layer 3. The magnetization of the second ferromagnetic layer 2 is reversed by receiving spin transfer torque (STT) due to the spin-polarized current. As the relative angle between the direction of magnetization of the first ferromagnetic layer 1 and the direction of magnetization of the second ferromagnetic layer 2 changes, the resistance value of the magnetoresistive effect element 10 in the lamination direction changes. The resistance value of the magnetoresistive effect element 10 in the lamination direction is read by the measurement unit 23. That is, the magnetic recording element 101 shown in FIG. 8 is a spin transfer torque (STT) type magnetic recording element.

The magnetic recording element 101 shown in FIG. 8 can accurately record data by being driven at low power consumption since the magnetoresistive effect element 10 has a large MR ratio and a low RA.

Figure 9:
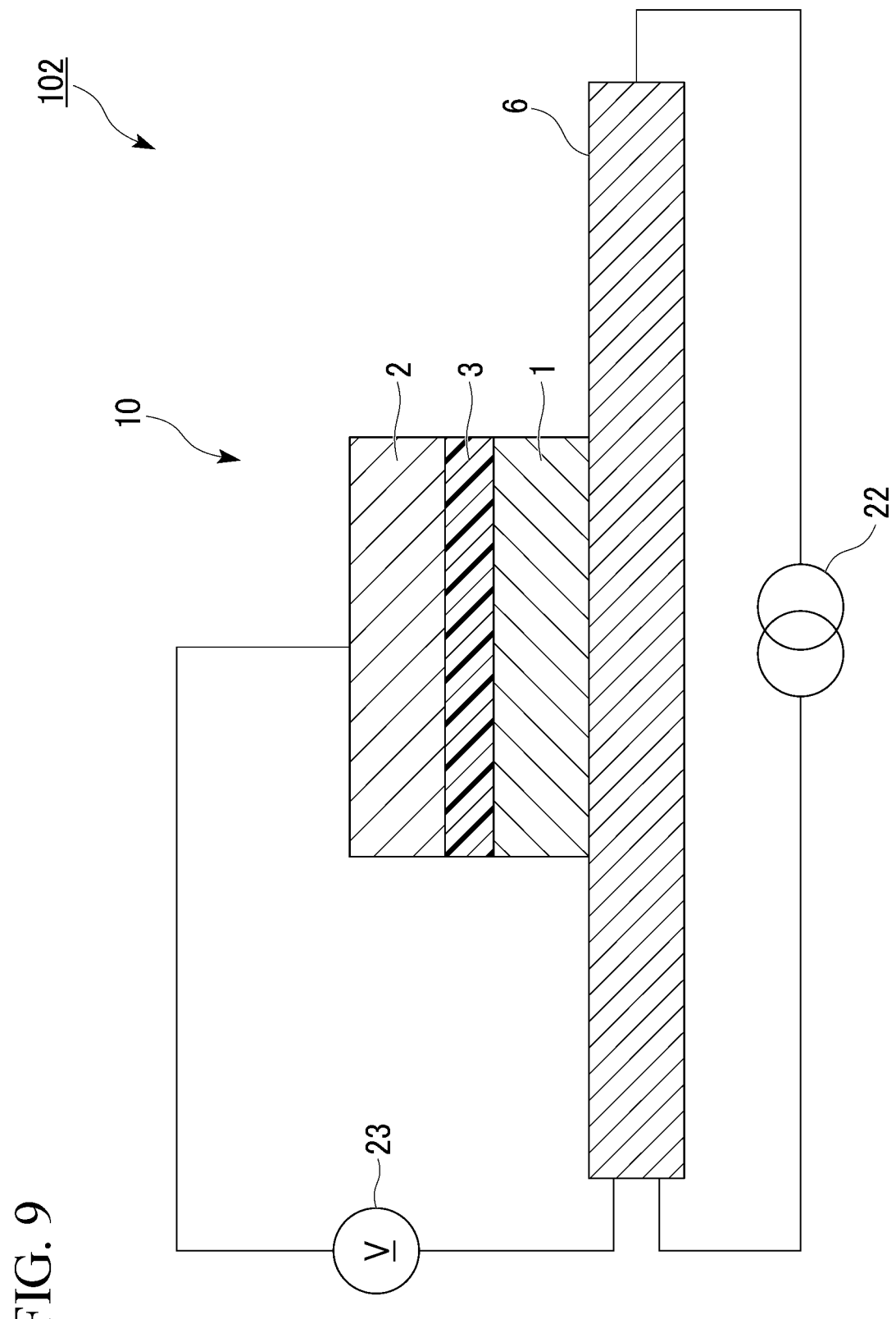
FIG. 9 is a cross-sectional view of a magnetic recording element according to Application Example 3.

FIG. 9 is a cross-sectional view of a magnetic recording element 102 according to Application Example 3. FIG. 9 is a cross-sectional view in which the magnetic recording element 102 is cut along the lamination direction.

As shown in FIG. 9, the magnetic recording element 102 includes the magnetoresistive effect element 10, a wiring 6, the power supply 22, and the measurement unit 23. The wiring 6 contacts, for example, the first ferromagnetic layer 1 of the magnetoresistive effect element 10. The power supply 22 is connected to both ends of the wiring 6. The measurement unit 23 is connected to the second ferromagnetic layer 2 and one end of the wiring 6. In the example of FIG. 9, the first ferromagnetic layer 1 is a magnetization free layer and the second ferromagnetic layer 2 is a magnetization fixed layer.

When a potential difference is generated between a first end and a second end of the wiring 6 by the power supply 22, a current flows in the in-plane direction of the wiring 6. The wiring 6 has a function of generating a spin current due to a spin Hall effect generated when a current flows. When a current flows in the in-plane direction of the wiring 6, a spin Hall effect is generated due to the effect of the spin-orbit interaction. The spin Hall effect is a phenomenon in which a moving spin is bent in a direction orthogonal to the current flow direction. The spin Hall effect causes an uneven distribution in the wiring 6 and induces a spin current in the thickness direction of the wiring 6. The spin is injected from the wiring 6 into the first ferromagnetic layer 1 by the spin current.

The wiring 6 contains any one of a metal, an alloy, an intermetallic compound, a metal boride, a metal carbide, a metal silicate, and a metal phosphoride having a function of generating a spin current by the spin Hall effect when a current flows. For example, the wiring 6 contains a non-magnetic metal having an atomic number of 39 or more having d electrons or f electrons in the outermost shell.

The spin injected to the first ferromagnetic layer 1 applies spin-orbit torque (SOT) to the magnetization of the first ferromagnetic layer 1. The first ferromagnetic layer 1 reverses the magnetization by spin-orbit torque (SOT). As the direction of magnetization of the first ferromagnetic layer 1 and the direction of magnetization of the second ferromagnetic layer 2 are reversed, the resistance value of the magnetoresistive effect element 10 in the lamination direction changes. The resistance value of the magnetoresistive effect element 10 in the lamination direction is read by the measurement unit 23. That is, the magnetic recording element 102 shown in FIG. 9 is a spin-orbit torque (SOT) type magnetic recording element.

The magnetic recording element 102 shown in FIG. 9 can accurately record data be being driven at low power consumption since the magnetoresistive effect element 10 has a large MR ratio and a low RA.

Figure 10:
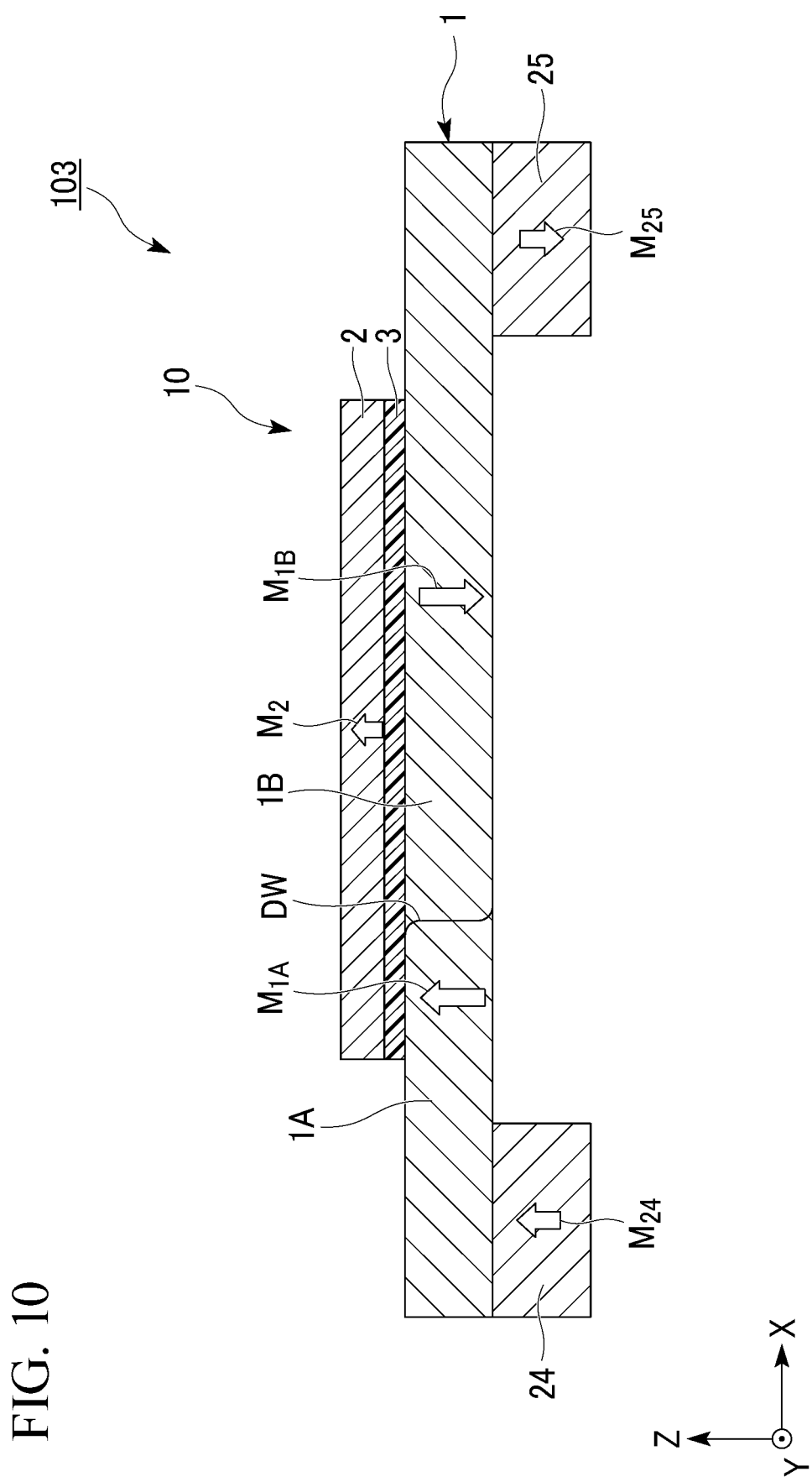
FIG. 10 is a cross-sectional view of a magnetic domain wall displacement element according to Application Example 4.

FIG. 10 is a cross-sectional view of a magnetic domain wall displacement element (a magnetic domain wall displacement type magnetic recording element) according to Application Example 4.

A magnetic domain wall displacement element 103 includes the magnetoresistive effect element 10, a first magnetization fixed layer 24, and a second magnetization fixed layer 25. The magnetoresistive effect element 10 includes the first ferromagnetic layer 1, the second ferromagnetic layer 2, and the non-magnetic layer 3. In FIG. 10, a direction in which the first ferromagnetic layer 1 extends is referred to as the X direction, a direction perpendicular to the X direction is referred to as the Y direction, and a direction perpendicular to the XY plane is referred to as the Z direction.

The first magnetization fixed layer 24 and the second magnetization fixed layer 25 are connected to a first end and a second end of the first ferromagnetic layer 1. The first end and the second end sandwich the second ferromagnetic layer 2 and the non-magnetic layer 3 in the X direction.

The first ferromagnetic layer 1 is a layer capable of magnetically recording information by changing the internal magnetic state. The first ferromagnetic layer 1 includes a first magnetic domain 1A and a second magnetic domain 1B therein. The magnetization at a position overlapping the first magnetization fixed layer 24 or the second magnetization fixed layer 25 in the first ferromagnetic layer 1 in the Z direction is fixed to one direction. The magnetization at a position overlapping the first magnetization fixed layer 24 in the Z direction is fixed to, for example, the +Z direction and the magnetization at a position overlapping the second magnetization fixed layer 25 in the Z direction is fixed to, for example, the −Z direction. As a result, a magnetic domain wall DW is formed in the boundary between the first magnetic domain 1A and the second magnetic domain 1B. The first ferromagnetic layer 1 can have the magnetic domain wall DW therein. In the first ferromagnetic layer 1 shown in FIG. 8, the magnetization $M_{1A}$ of the first magnetic domain 1A is oriented in the +Z direction and the magnetization $M_{1B}$ of the second magnetic domain 1B is oriented in the −Z direction.

The magnetic domain wall displacement element 103 can record data in multiple values or continuously depending on the position of the domain wall DW of the first ferromagnetic layer 1. The data recorded in the first ferromagnetic layer 1 is read out as a change in the resistance value of the magnetic domain wall displacement element 103 when a read-out current is applied.

A ratio between the first magnetic domain 1A and the second magnetic domain 1B in the first ferromagnetic layer 1 changes when the magnetic domain wall DW moves. For example, the magnetization M2 of the second ferromagnetic layer 2 is the same direction as (parallel to) the magnetization MIA of the first magnetic domain 1A and is the direction opposite to (antiparallel to) the magnetization $M_{1B}$ of the second magnetic domain 1B. When the magnetic domain wall DW moves in the +X direction and the area of the first magnetic domain 1A in a portion overlapping the second ferromagnetic layer 2 in the plan view from the Z direction is widened, the resistance value of the magnetic domain wall displacement element 103 decreases. In contrast, when the magnetic domain wall DW moves in the −X direction and the area of the second magnetic domain 1B in a portion overlapping the second ferromagnetic layer 2 in the plan view from the Z direction is widened, the resistance value of the magnetic domain wall displacement element 103 increases.

The magnetic domain wall DW moves in such a manner that a writing current flows in the X direction of the first ferromagnetic layer 1 or an external magnetic field is applied. For example, when a writing current (for example, a current pulse) is applied in the +X direction of the first ferromagnetic layer 1, electrons flow in the −X direction opposite to that of the current and hence the magnetic domain wall DW moves in the −X direction. When a current flows from the first magnetic domain 1A to the second magnetic domain 1B, the spin-polarized electrons in the second magnetic domain 1B reverse the magnetization $M_{1A}$ of the first magnetic domain 1A. As the magnetization $M_{1A}$ of the first magnetic domain 1A is reversed, the magnetic domain wall DW moves in the −X direction.

The magnetic domain wall displacement element 103 shown in FIG. 10 can accurately record data by being driven at low power consumption since the magnetoresistive effect element 10 has a large MR ratio and a low RA.

Figure 11:
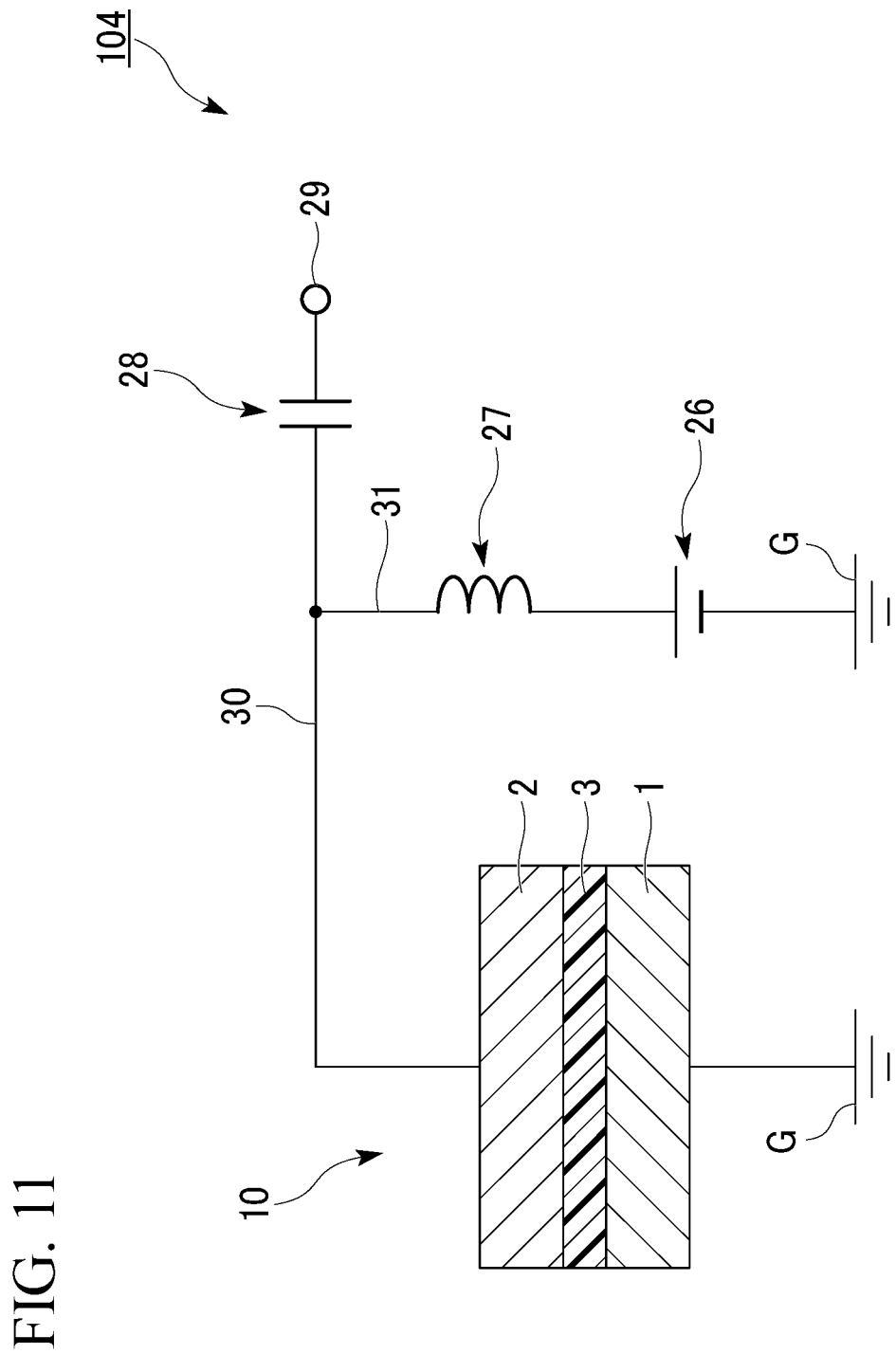
FIG. 11 is a schematic view of a high frequency device according to Application Example 5.

FIG. 11 is a schematic view of a high frequency device 104 according to Application Example 5. As shown in FIG. 11, the high frequency device 104 includes the magnetoresistive effect element 10, a DC power supply 26, an inductor 27, a capacitor 28, an output port 29, and wirings 30 and 31.

The wiring 30 connects the magnetoresistive effect element 10 and the output port 29. The wiring 31 branches from the wiring 30 and reaches a ground G via the inductor 27 and the DC power supply 26. Known configurations can be used as the DC power supply 26, the inductor 27, and the capacitor 28. The inductor 27 cuts a high frequency component of a current and passes an invariant component of the current. The capacitor 28 passes a high frequency component of a current and cuts an invariant component of the current. The inductor 27 is disposed in a portion where the flow of the high frequency current is desired to be suppressed and the capacitor 28 is disposed in a portion where the flow of the direct current is desired to be suppressed.

When an alternating current or an alternating magnetic field is applied to the ferromagnetic layer included in the magnetoresistive effect element 10, the magnetization of the second ferromagnetic layer 2 moves in a precession manner. The magnetization of the second ferromagnetic layer 2 vibrates strongly when the frequency of the high frequency current or the high frequency magnetic field applied to the second ferromagnetic layer 2 is close to the ferromagnetic resonance frequency of the second ferromagnetic layer 2 and does not vibrate much at the frequency away from the ferromagnetic resonance frequency of the second ferromagnetic layer 2. This phenomenon is called a ferromagnetic resonance phenomenon.

The resistance value of the magnetoresistive effect element 10 changes due to the vibration of the magnetization of the second ferromagnetic layer 2. The DC power supply 26 applies a direct current to the magnetoresistive effect element 10. The direct current flows in the lamination direction of the magnetoresistive effect element 10. The direct current flows to the ground G through the wirings 30 and 31 and the magnetoresistive effect element 10. The potential of the magnetoresistive effect element 10 change according to Ohm's law. The high frequency signal is output from the output port 29 in response to a change in the potential (a change in the resistance value) of the magnetoresistive effect element 10.

The high frequency device 104 shown in FIG. 11 is driven at low power consumption since the magnetoresistive effect element 10 has a large MR ratio, can emit a high frequency signal with a large output, and has a low RA.

EXAMPLES

Example 1

As Example 1, the magnetoresistive effect element 12 shown in FIG. 6 was produced. The non-magnetic layer 3 of the magnetoresistive effect element 12 was Mg—Al—Ti—O. The MR ratio and RA of each magnetoresistive effect element were obtained by changing the concentration of Ti. Further, the underlayer was Ta/Ru, the cap layer was Ru/Ta/Ru, and the first ferromagnetic layer 1 and the second ferromagnetic layer 2 were Co—Fe—B alloys.

The magnetoresistive effect element 12 according to Example 1 was produced by the following procedure. First, a Ta/Ru underlayer was formed on an amorphous substrate by sputtering. Next, the first ferromagnetic layer having the above-described composition was formed.

Next, MgO, Mg—Al—O, Ti, the second ferromagnetic layer, and the cap layer were sequentially laminated and annealed on the first ferromagnetic layer. MgO formed the MgO layer 4. A part of Mg—Al—O formed the Mg—Al—O layer 5. Ti was combined with Mg—Al—O to form Mg—Al—Ti—O. Mg—Al—Ti—O corresponds to the non-magnetic layer 3. The cap layer is Ru/Ta/Ru.

Example 2

Example 2 was different from Example 1 in that the method of producing the tunnel barrier layer was changed. Mg—Al—O, Ti, the second ferromagnetic layer, and the cap layer were sequentially laminated and annealed on the first ferromagnetic layer. A part of Mg—Al—O formed the Mg—Al—O layer 5. Ti was combined with Mg—Al—O to form Mg—Al—Ti—O. In order to properly evaluate RA, the tunnel barrier film thickness was the same as in Example 1.

Example 3

Example 3 was different from Example 1 in that the method of producing the tunnel barrier layer was changed. MgO, Mg—Al—O, Ti, the second ferromagnetic layer, and the cap layer were sequentially laminated on the first ferromagnetic layer and annealed. MgO formed the MgO layer 4. The Mg—Al—O film thickness was adjusted so that all Mg—Al—O was combined with Ti to form Mg—Al—Ti—O. In order to properly evaluate the RA, the tunnel barrier film thickness was set as that of Example 1.

The MR ratio and RA of the produced magnetoresistive effect element 12 were measured.

Regarding the MR ratio, a change in the resistance value of the magnetoresistive effect element 12 was measured by monitoring a voltage applied to the magnetoresistive effect element 12 using a voltmeter while sweeping the magnetic field from the outside to the magnetoresistive effect element 10 with a constant current flowing in the lamination direction of the magnetoresistive effect element. The resistance value when the directions of magnetization of the first ferromagnetic layer 1 and the second ferromagnetic layer 2 were parallel and the resistance value when the directions of magnetization of the first ferromagnetic layer 1 and the second ferromagnetic layer 2 were antiparallel were measured and the MR ratio was calculated from the obtained resistance values according to the following formula. The MR ratio was measured at 300 K (room temperature).

MR ratio (%)=$(R_{AP}-R_P)/R_P \times 100$ $R_P$ is the resistance value when the directions of magnetization of the first ferromagnetic layer 1 and the second ferromagnetic layer 2 are parallel and $R_{AP}$ is the resistance value when the directions of magnetization of the first ferromagnetic layer 1 and the second ferromagnetic layer 2 are antiparallel.

RA was obtained by the product of the resistance $R_P$ when the directions of magnetization of the first ferromagnetic layer 1 and the second ferromagnetic layer 2 were parallel and the area A in the in-plane direction of the magnetoresistive effect element 12.

Figure 12:
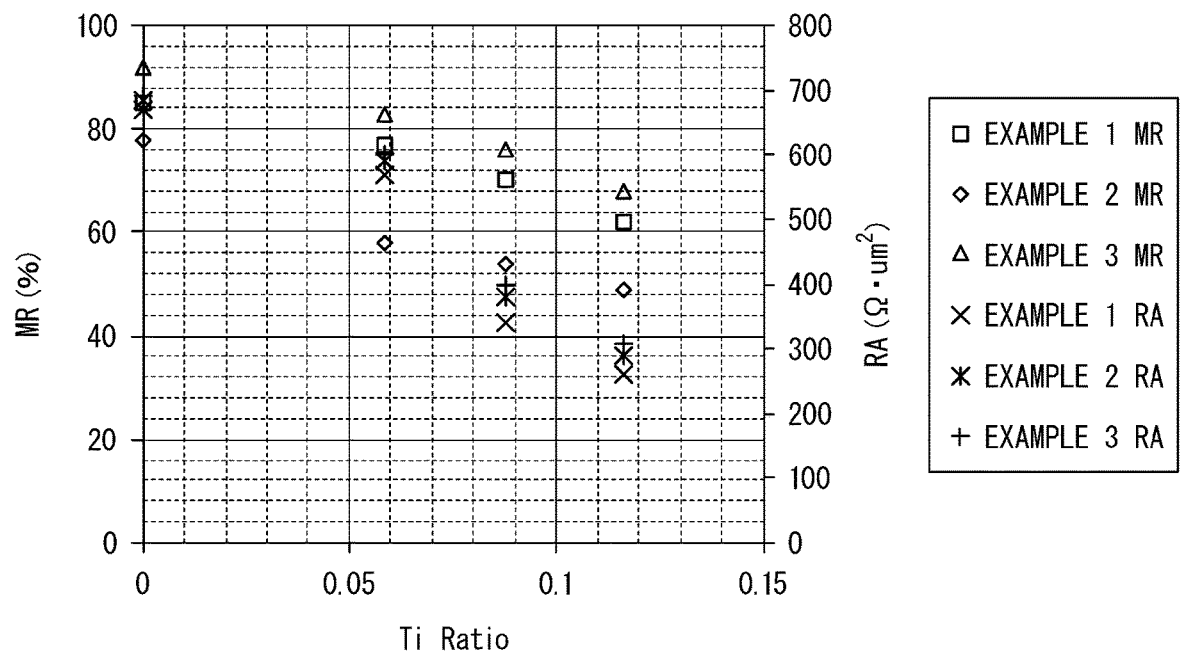
FIG. 12 shows the results of Examples 1 to 3.

FIG. 12 shows the measurement results of Examples 1 to 3. A horizontal axis of FIG. 12 indicates the concentration of Ti of the non-magnetic layer. A vertical axis of FIG. 12 indicates the MR ratio and RA of the magnetoresistive effect element. As shown in FIG. 12, the RA largely decreased as the concentration of Ti of the non-magnetic layer increased. In contrast, the decrease in the MR ratio of the magnetoresistive effect element was small.

Example 4

In Example 4, not only the concentration ratio of Ti but also the concentration ratio of Mg and Al was changed.

As Example 4, the magnetoresistive effect element 10 shown in FIG. 1 was produced. The non-magnetic layer 3 of the magnetoresistive effect element 10 was Mg—Al—Ti—O. The MR ratio and RA of each magnetoresistive effect element were obtained by changing the concentration of each of Mg, Al, and Ti. Further, the underlayer was formed below the first ferromagnetic layer 1 and the cap layer was formed above the second ferromagnetic layer 2. The underlayer was Ta/Ru, the cap layer was Ru/Ta/Ru, and the first ferromagnetic layer 1 and the second ferromagnetic layer 2 were Co—Fe—B alloys.

The magnetoresistive effect element 10 according to Example 4 was produced according to the following procedure. First, a Ta/Ru underlayer was formed on an amorphous substrate by sputtering. Next, the first ferromagnetic layer having the above-described composition was formed.

Next, Mg—Al—O, Ti, the second ferromagnetic layer, and the cap layer were sequentially laminated on the first ferromagnetic layer and annealed. All Mg—Al—O was combined with Ti to form the non-magnetic layer 3. The non-magnetic layer 3 was represented by Mg—Al—Ti—O. The composition ratio of Mg, Al, and Ti was adjusted by changing the composition ratio of the target.

In Example 4, specifically, a sample under the conditions shown in Table 1 below was produced. x is the composition ratio of Mg with respect to the total amount of Mg, Al, and Ti. y is the composition ratio of Al with respect to the total amount of Mg, Al, and Ti. z is the composition ratio of Ti with respect to the total amount of Mg, Al, and Ti.

TABLE 1

| x | y | z | RA (standardization) | MR RATIO (standardization) |
|---|---|---|---|---|
| 11.6 | 0.2 | 0.2 | 0.08 | 0.67 |
| 9.8 | 2.0 | 0.2 | 0.1 | 0.83 |
| 9.8 | 0.2 | 2.0 | 0.5 | 2.46 |
| 7.8 | 4.0 | 0.2 | 0.9 | 0.95 |
| 8.0 | 2.0 | 2.0 | 0.68 | 2.22 |
| 7.8 | 0.2 | 4.0 | 0.17 | 2.43 |
| 5.8 | 6.0 | 0.2 | 0.77 | 0.47 |
| 6.0 | 4.0 | 2.0 | 0.83 | 1.98 |
| 6.0 | 2.0 | 4.0 | 0.01 | 1.68 |
| 5.8 | 0.2 | 6.0 | 0.01 | 1.26 |
| 4.0 | 7.8 | 0.2 | 0.73 | 0.27 |
| 4.0 | 6.0 | 2.0 | 0.01 | 3.24 |
| 4.0 | 4.0 | 4.0 | 0.01 | 1.46 |
| 4.0 | 2.0 | 6.0 | 0.04 | 1.14 |
| 4.0 | 0.2 | 7.8 | 0.01 | 0.78 |
| 2.0 | 9.8 | 0.2 | 0.15 | 0.89 |
| 2.0 | 8.0 | 2.0 | 0.01 | 0.25 |
| 2.0 | 6.0 | 4.0 | 0.01 | 1.23 |
| 2.0 | 4.0 | 6.0 | 0.01 | 1.18 |
| 2.0 | 2.0 | 8.0 | 0.01 | 0.15 |
| 2.0 | 0.2 | 9.8 | 0.02 | 0.29 |
| 0.2 | 11.6 | 0.2 | 0.14 | 0.22 |
| 0.2 | 9.8 | 2.0 | 0.01 | 0.57 |
| 0.2 | 7.8 | 4.0 | 0.01 | 0.92 |
| 0.2 | 6.0 | 5.8 | 0.01 | 0.78 |
| 0.2 | 4.0 | 7.8 | 0.01 | 0.55 |
| 0.2 | 2.0 | 9.8 | 0.01 | 0.78 |
| 0.2 | 0.2 | 11.6 | 0.04 | 0.79 |
| 10.8 | 0.2 | 1.0 | 0.28 | 2.37 |
| 10.0 | 1.0 | 1.0 | 0.88 | 2.58 |
| 9.0 | 2.0 | 1.0 | 0.72 | 2.11 |
| 8.0 | 3.0 | 1.0 | 0.12 | 2.73 |
| 7.0 | 4.0 | 1.0 | 0.25 | 2.08 |
| 6.0 | 5.0 | 1.0 | 0.01 | 2.2 |
| 5.0 | 6.0 | 1.0 | 0.17 | 2.43 |
| 4.0 | 7.0 | 1.0 | 0.49 | 2.72 |
| 3.0 | 7.0 | 2.0 | 0.27 | 2.53 |
| 3.0 | 6.0 | 3.0 | 0.47 | 2.56 |
| 4.0 | 5.0 | 3.0 | 0.27 | 2.28 |

TABLE 1-continued

| x | y | z | RA (standardization) | MR RATIO (standardization) |
|---|---|---|---|---|
| 5.0 | 4.0 | 3.0 | 0.1 | 2.48 |
| 6.0 | 3.0 | 3.0 | 0.84 | 2.53 |
| 7.0 | 2.0 | 3.0 | 0.41 | 2.11 |
| 7.0 | 1.0 | 4.0 | 0.61 | 2.14 |
| 6.8 | 0.2 | 5.0 | 0.84 | 2.23 |
| 2.0 | 7.0 | 3.0 | 0.99 | 1.1 |
| 1.0 | 7.0 | 4.0 | 0.6 | 1.18 |
| 1.0 | 6.0 | 5.0 | 0.49 | 1.08 |
| 1.0 | 5.0 | 6.0 | 0.56 | 1.14 |
| 1.0 | 4.0 | 7.0 | 0.99 | 1.22 |
| 2.0 | 3.0 | 7.0 | 0.55 | 1.07 |
| 3.0 | 2.0 | 7.0 | 0.3 | 1.09 |
| 4.0 | 1.0 | 7.0 | 0.07 | 1.23 |
| 5.0 | 0.2 | 6.8 | 0.63 | 1.24 |

The RA and MR ratio for each composition are shown in Table 1. The values of RA and MR ratios show standardized values when the RA and MR ratios of $Mg(AlGa)_2O_4$ are set to 1, respectively.

In any case, RA was lower than when the non-magnetic layer was $Mg(AlGa)_2O_4$. Each composition in FIG. 2 shows the standardized MR ratio obtained in the experiment. Among these, in the conditions included in the regions shown in the region 201 and the region 202 of FIG. 2, the MR ratio was improved as compared with $Mg(AlGa)_2O_4$ and in the conditions included in the region shown in the region 201, the MR ratio was particularly high.

Example 5

Example 5 is different from Example 4 in that the X element is changed from Ti to Pt. In Example 5, the concentration ratio of each of Mg, Al, and Pt was changed.

In Example 5, the production was performed in the same procedure as that of Example 4 except that the X element was changed from Ti to Pt. The composition ratio of Mg, Al, and Pt was adjusted by changing the composition ratio of the target.

In Example 5, specifically, a sample under the conditions shown in Table 2 below was produced. x is the composition ratio of Mg with respect to the total amount of Mg, Al, and Pt. y is the composition ratio of Al with respect to the total amount of Mg, Al, and Pt. z is the composition ratio of Pt with respect to the total amount of Mg, Al, and Pt.

TABLE 2

| x | y | z | RA (standardization) | MR RATIO (standardization) |
|---|---|---|---|---|
| 11.6 | 0.2 | 0.2 | 0.07 | 0.54 |
| 9.8 | 2.0 | 0.2 | 0.08 | 0.91 |
| 7.8 | 4.0 | 0.2 | 0.87 | 0.92 |
| 5.8 | 6.0 | 0.2 | 0.83 | 0.51 |
| 4.0 | 7.8 | 0.2 | 0.76 | 0.34 |
| 2.0 | 9.8 | 0.2 | 0.22 | 0.78 |
| 0.2 | 11.6 | 0.2 | 0.21 | 0.56 |
| 9.8 | 0.2 | 2.0 | 0.53 | 1.25 |
| 8.0 | 2.0 | 2.0 | 0.01 | 1.45 |
| 6.0 | 4.0 | 2.0 | 0.01 | 3.75 |
| 4.0 | 6.0 | 2.0 | 0.02 | 6.35 |
| 2.0 | 8.0 | 2.0 | 0.05 | 0.71 |
| 0.2 | 9.8 | 2.0 | 0.45 | 0.53 |
| 7.8 | 0.2 | 4.0 | 0.43 | 1.82 |
| 6.0 | 2.0 | 4.0 | 0.03 | 1.94 |
| 4.0 | 4.0 | 4.0 | 0.01 | 3.65 |
| 2.0 | 6.0 | 4.0 | 0.18 | 2.68 |
| 0.2 | 7.8 | 4.0 | 0.07 | 0.49 |
| 5.8 | 0.2 | 6.0 | 0.70 | 1.92 |
| 4.0 | 2.0 | 6.0 | 0.01 | 8.53 |
| 2.0 | 4.0 | 6.0 | 0.01 | 8.66 |
| 0.2 | 5.8 | 6.0 | 0.28 | 0.36 |
| 4.0 | 0.2 | 7.8 | 0.74 | 4.32 |
| 2.0 | 2.0 | 8.0 | 0.01 | 9.27 |
| 0.2 | 4.0 | 7.8 | 0.28 | 0.34 |
| 2.0 | 0.2 | 9.8 | 0.58 | 0.87 |
| 0.2 | 2.0 | 9.8 | 0.43 | 0.56 |
| 0.2 | 0.2 | 11.6 | 0.33 | 0.51 |
| 10.8 | 0.2 | 1.0 | 0.63 | 1.12 |
| 10.0 | 1.0 | 1.0 | 0.61 | 1.21 |
| 9.0 | 2.0 | 1.0 | 0.25 | 1.25 |
| 8.0 | 3.0 | 1.0 | 0.37 | 2.34 |
| 7.0 | 4.0 | 1.0 | 0.01 | 2.34 |
| 6.0 | 5.0 | 1.0 | 0.32 | 2.56 |
| 5.0 | 6.0 | 1.0 | 0.85 | 2.42 |
| 4.0 | 7.0 | 1.0 | 0.02 | 2.13 |
| 3.0 | 8.0 | 1.0 | 0.62 | 0.85 |
| 1.0 | 8.0 | 3.0 | 0.04 | 0.57 |
| 3.0 | 7.0 | 2.0 | 0.96 | 2.21 |
| 2.0 | 7.0 | 3.0 | 0.25 | 2.16 |
| 1.0 | 7.0 | 4.0 | 0.67 | 2.06 |
| 1.0 | 6.0 | 5.0 | 0.35 | 2.01 |
| 1.0 | 5.0 | 6.0 | 0.65 | 2.24 |
| 1.0 | 4.0 | 7.0 | 0.49 | 2.32 |
| 1.0 | 3.0 | 8.0 | 0.41 | 2.16 |
| 1.0 | 2.0 | 9.0 | 0.78 | 2.13 |
| 2.0 | 1.0 | 9.0 | 0.66 | 2.01 |
| 3.0 | 0.2 | 8.8 | 0.99 | 2.16 |
| 1.0 | 1.0 | 10.0 | 0.17 | 0.93 |
| 7.0 | 3.0 | 2.0 | 0.28 | 2.36 |
| 6.0 | 3.0 | 3.0 | 0.98 | 2.13 |
| 5.0 | 3.0 | 4.0 | 0.70 | 2.19 |
| 5.0 | 2.0 | 5.0 | 0.37 | 2.02 |
| 5.0 | 1.0 | 6.0 | 0.58 | 2.34 |
| 5.0 | 0.2 | 6.8 | 0.32 | 2.61 |
| 7.0 | 2.0 | 3.0 | 0.93 | 1.34 |
| 6.0 | 1.0 | 5.0 | 0.12 | 1.87 |

The RA and MR ratio for each composition are shown in Table 2. The values of the RA and MR ratio show standardized values when the RA and MR ratio of $Mg(AlGa)_2O_4$ are set to 1, respectively.

In any case, RA was lower than when the non-magnetic layer was $Mg(AlGa)_2O_4$. Each composition in FIG. 3 shows the standardized MR ratio obtained in the experiment. Among these, in the conditions included in the regions shown in the region 301 and the region 302 of FIG. 3, the MR was higher than when the non-magnetic layer was $Mg(AlGa)_2O_4$ and in the conditions included in the region shown in the region 302 among these, the MR ratio was particularly high.

Example 6

Example 6 is different from Example 4 in that the X element is changed from Ti to W. In Example 6, the concentration ratio of each of Mg, Al, and W was changed.

In Example 6, the production was performed in the same procedure as that of Example 4 except that the X element was changed from Ti to W. The composition ratio of Mg, Al, and W was adjusted by changing the composition ratio of the target.

In Example 6, specifically, a sample under the conditions below was produced. x is the composition ratio of Mg with respect to the total amount of Mg, Al, and W. y is the composition ratio of Al with respect to the total amount of Mg, Al, and W. z is the composition ratio of W with respect to the total amount of Mg, Al, and W.

TABLE 3

| x | y | z | RA (standardization) | MR RATIO (standardization) |
|---|---|---|---|---|
| 0.2 | 11.6 | 0.2 | 0.12 | 0.24 |
| 2.0 | 9.8 | 0.2 | 0.17 | 0.87 |
| 4.0 | 7.8 | 0.2 | 0.77 | 0.24 |
| 5.8 | 6.0 | 0.2 | 0.74 | 0.41 |
| 7.8 | 4.0 | 0.2 | 0.89 | 0.96 |
| 9.8 | 2.0 | 0.2 | 0.12 | 0.91 |
| 11.6 | 0.2 | 0.2 | 0.09 | 0.62 |
| 10.8 | 0.2 | 1.0 | 0.01 | 1.13 |
| 10.0 | 1.0 | 1.0 | 0.02 | 1.41 |
| 9.0 | 2.0 | 1.0 | 0.55 | 1.83 |
| 8.0 | 3.0 | 1.0 | 0.68 | 2.41 |
| 7.0 | 4.0 | 1.0 | 0.72 | 3.37 |
| 6.0 | 5.0 | 1.0 | 0.32 | 2.45 |
| 5.0 | 6.0 | 1.0 | 0.89 | 2.30 |
| 4.0 | 7.0 | 1.0 | 0.26 | 1.56 |
| 3.0 | 8.0 | 1.0 | 0.43 | 1.86 |
| 2.0 | 9.0 | 1.0 | 0.58 | 1.17 |
| 0.2 | 9.8 | 2.0 | 0.62 | 0.25 |
| 2.0 | 8.0 | 2.0 | 0.05 | 2.48 |
| 4.0 | 6.0 | 2.0 | 0.02 | 2.84 |
| 6.0 | 4.0 | 2.0 | 0.01 | 7.92 |
| 8.0 | 2.0 | 2.0 | 0.01 | 7.20 |
| 9.8 | 0.2 | 2.0 | 0.80 | 1.52 |
| 2.0 | 7.0 | 3.0 | 0.84 | 3.46 |
| 1.0 | 8.0 | 3.0 | 0.93 | 1.40 |
| 0.2 | 7.8 | 4.00 | 0.53 | 0.42 |
| 2.0 | 6.0 | 4.00 | 0.04 | 5.51 |
| 4.0 | 4.0 | 4.00 | 0.04 | 1.83 |
| 6.0 | 2.0 | 4.00 | 0.11 | 2.21 |
| 7.8 | 0.2 | 4.00 | 0.32 | 2.67 |
| 1.0 | 7.0 | 4.00 | 0.22 | 1.22 |
| 2.0 | 5.0 | 5.00 | 0.16 | 1.45 |
| 3.0 | 4.0 | 5.00 | 0.89 | 1.42 |
| 4.0 | 3.0 | 5.00 | 0.93 | 1.25 |
| 5.0 | 2.0 | 5.00 | 0.55 | 1.56 |
| 6.0 | 1.0 | 5.00 | 0.85 | 1.87 |
| 6.8 | 0.2 | 5.00 | 0.76 | 2.01 |
| 1.0 | 6.0 | 5.00 | 0.88 | 1.33 |
| 0.2 | 5.8 | 6.00 | 0.44 | 0.24 |
| 2.0 | 4.0 | 6.00 | 0.01 | 0.81 |
| 4.0 | 2.0 | 6.00 | 0.03 | 0.19 |
| 5.8 | 0.2 | 6.00 | 0.82 | 0.74 |
| 0.2 | 4.0 | 7.80 | 0.66 | 0.13 |
| 2.0 | 2.0 | 8.00 | 0.04 | 0.43 |
| 4.0 | 0.2 | 7.80 | 0.56 | 0.21 |
| 0.2 | 2.0 | 9.80 | 0.01 | 0.41 |
| 2.0 | 0.2 | 9.80 | 0.47 | 0.22 |
| 0.2 | 0.2 | 11.60 | 0.01 | 0.12 |
| 1.0 | 9.0 | 2.00 | 0.63 | 1.15 |
| 1.1 | 10.0 | 1.00 | 0.23 | 0.47 |

The RA and MR ratio for each composition are shown in Table 3. The values of the RA and MR ratio show standardized values when the RA and MR ratio of Mg(AlGa)$_2$O$_4$ are set to 1, respectively.

In any case, RA was lower than when the non-magnetic layer was Mg(AlGa)$_2$O$_4$. Each composition in FIG. 4 shows the standardized MR ratio obtained in the experiment. Among these, in the conditions included in the region shown in the region 401 of FIG. 4, the MR ratio was particularly high.

Example 7

In Example 7, the influence on the MR ratio and RA when the space group of the non-magnetic layer 3 was changed was examined.

As Example 7, the magnetoresistive effect element 10 shown in FIG. 1 was produced. The non-magnetic layer 3 of the magnetoresistive effect element 10 was Mg—Al—Ti—O. Further, the underlayer was formed below the first ferromagnetic layer 1 and the cap layer was formed above the second ferromagnetic layer 2. The underlayer was Ta/Ru, the cap layer was Ru/Ta/Ru, and the first ferromagnetic layer 1 and the second ferromagnetic layer 2 were Co—Fe—B alloys.

In Example 7, three types of space groups of the non-magnetic layer 3 were prepared: a sample of Imma (sample 1), a sample of P4$_1$22 (sample 2), and a sample of P1 (sample 3). The conditions other than the procedure for changing the space group were the same for all three samples.

The non-magnetic layer 3 of the sample of Imma (sample 1) was produced by the following procedure. First, a film of Mg—Al—O was formed on the first ferromagnetic layer to have a thickness of 0.2 nm and was subjected to heat treatment at 250° C. Next, a film of Ti—O was formed to have a thickness of 0.1 nm and was subjected to heat treatment at 250° C. Next, a film of Mg was formed to have a thickness of 0.1 nm and was subjected to heat treatment at 250° C. Next, a film of Ti was formed to have a thickness of 0.1 nm and was subjected to heat treatment at 250° C. Next, a film of Mg—Al was formed to have a thickness of 0.2 nm and was subjected to heat treatment at 300° C.

The non-magnetic layer 3 of the sample of P4$_1$22 (sample 2) was produced by the following procedure. First, a film of Mg—Al—O was formed on the first ferromagnetic layer to have a thickness of 0.2 nm and was subjected to heat treatment at 250° C. Next, a film of Mg—Ti—O was formed to have a thickness of 0.2 nm and was subjected to heat treatment at 250° C. Next, a film of Mg—Al—O was formed to have a thickness of 0.2 nm and was subjected to heat treatment at 300° C.

The non-magnetic layer 3 of the sample of P1 (sample 3) was formed in such a manner that a film of Mg—Al—Ti—O was formed on the first ferromagnetic layer to have a thickness of 0.6 nm and was subjected to heat treatment at 300° C.

The MR ratio and RA of the magnetoresistive effect element of each of three samples were measured. The MR ratio and RA were standardized as below when the MR ratio and RA in the case of the non-magnetic layer formed of Mg(AlGa)$_2$O$_4$ were set to 1.

Sample 1: MR ratio (standardization)=3.1, RA (standardization)=0.04

Sample 2: MR ratio (standardization)=5.6, RA (standardization)=0.01

Sample 3: MR ratio (standardization)=1.1, RA (standardization)=0.12

In each sample, RA was lower than when the non-magnetic layer was Mg(AlGa)$_2$O$_4$ and the MR ratio was particularly high in the sample of Imma (sample 1) and the sample of P4$_1$22 (sample 2) having high symmetry.

Example 8

Example 8 is different from Example 7 in that the X element is changed from Ti to Pt. That is, the non-magnetic layer 3 was Mg—Al—Pt—O. The other conditions were the same as those of Example 7.

In Example 8, three types of space groups of the non-magnetic layer 3 were prepared: a sample of Imma (sample 4), a sample of P4$_1$22 (sample 5), and a sample of P1 (sample 6). The conditions other than the procedure for changing the space group were the same for all three samples.

The non-magnetic layer 3 of the sample of Imma (sample 4) was produced by the following procedure. First, a film of Mg—Al—O was formed on the first ferromagnetic layer to have a thickness of 0.2 nm and was subjected to heat treatment at 250° C. Next, a film of Pt—O was formed to have a thickness of 0.1 nm and was subjected to heat treatment at 260° C. Next, a film of Mg was formed to have a thickness of 0.1 nm and was subjected to heat treatment at 250° C. Next, a film of Pt—O was formed to have a thickness of 0.1 nm and was subjected to heat treatment at 260° C. Next, a film of Mg—Al—O was formed to have a thickness of 0.2 nm and was subjected to heat treatment at 300° C.

The non-magnetic layer 3 of the sample of $P4_122$ (sample 5) was produced by the following procedure. First, a film of Mg—Al—O was formed on the first ferromagnetic layer to have a thickness of 0.2 nm and was subjected to heat treatment at 250° C. Next, a film of Mg—Pt—O was formed to have a thickness of 0.2 nm and was subjected to heat treatment at 260° C. Next, a film of Mg—Al—O was formed to have a thickness of 0.2 nm and was subjected to heat treatment at 300° C.

The non-magnetic layer 3 of the sample of P1 (sample 6) was formed in such a manner that a film of Mg—Al—Pt—O was formed on the first ferromagnetic layer to have a film thickness of 0.6 nm and was subjected to heat treatment at 300° C.

The MR ratio and RA of the magnetoresistive effect element of each of three samples were measured. The MR ratio and RA were standardized as below when the MR ratio and RA in the case of the non-magnetic layer formed of $Mg(AlGa)_2O_4$ were set to 1.

Sample 4: MR ratio (standardization)=4.7, RA (standardization)=0.06

Sample 5: MR ratio (standardization)=3.6, RA (standardization)=0.02

Sample 6: MR ratio (standardization)=1.3, RA (standardization)=0.09

In each sample, RA was lower than when the non-magnetic layer was $Mg(AlGa)_2O_4$ and the MR ratio was particularly high in the sample of Imma (sample 4) and the sample of $P4_122$ (sample 5) having high symmetry.

Example 9

Example 9 is different from Example 7 in that the X element is changed from Ti to W. That is, the non-magnetic layer 3 was Mg—Al—W—O. The other conditions were the same as those of Example 7.

In Example 9, three types of space groups of the non-magnetic layer 3 were prepared: a sample of Imma (sample 7), a sample of $P4_122$ (sample 8), and a sample of P1 (sample 9). The conditions other than the procedure for changing the space group were the same for all three samples.

The non-magnetic layer 3 of the sample of Imma (sample 7) was produced by the following procedure. First, a film of Mg—Al—O was formed on the first ferromagnetic layer to have a thickness of 0.2 nm and was subjected to heat treatment at 250°. Next, a film of W—O was formed to have a thickness of 0.1 nm and was subjected to heat treatment at 275° C. Next, a film of Mg—O was formed to have a thickness of 0.1 nm and was subjected to heat treatment at 250° C. Next, a film of W—O was formed to have a thickness of 0.1 nm and was subjected to heat treatment at 275° C. Next, a film of Mg—Al—O was formed to have a thickness of 0.2 nm and was subjected to heat treatment at 300° C.

The non-magnetic layer 3 of the sample $P4_122$ (sample 8) was produced by the following procedure. First, a film of Mg—Al—O was formed on the first ferromagnetic layer to have a thickness of 0.2 nm and was subjected to heat treatment at 250° C. Next, a film of Mg—W—O was formed to have a thickness of 0.2 nm and was subjected to heat treatment at 275° C. Next, a film of Mg—Al—O was formed to have a thickness of 0.2 nm and was subjected to heat treatment at 300° C.

The non-magnetic layer 3 of the sample of P1 (sample 9) was formed in such a manner that a film of Mg—Al—W—O was formed on the first ferromagnetic layer to have a thickness of 0.6 nm and was subjected to heat treatment at 300° C.

Then, the MR ratio and RA of the magnetoresistive effect element of each of three samples were measured. The MR ratio and RA were standardized as below when the MR ratio and RA in the case of the non-magnetic layer formed of $Mg(AlGa)_2O_4$ were set to 1.

Sample 7: MR ratio (standardization)=5.3, RA (standardization)=0.15 Sample 8: MR ratio (standardization)=4.1, RA (standardization)=0.24 Sample 9: MR ratio (standardization)=1.5, RA (standardization)=0.56

In each sample, RA was lower than when the non-magnetic layer was $Mg(AlGa)_2O_4$ and the MR ratio was particularly high in the sample of Imma (sample 7) and the sample of $P4_122$ (sample 8) having high symmetry.

EXPLANATION OF REFERENCES

1 First ferromagnetic layer
1A First magnetic domain
1B Second magnetic domain
2 Second ferromagnetic layer
3 Non-magnetic layer
3A First surface
3B Second surface
10, 11, 12 Magnetoresistive effect element
21 Resistance measuring instrument
22 Power supply
23 Measurement unit
24 First magnetization fixed layer
25 Second magnetization fixed layer
26 DC power supply
27 Inductor
28 Capacitor
29 Output port
30, 31 Wiring
100, 101, 102 Magnetic recording element
103 Magnetic domain wall displacement element
104 High frequency device
DW Magnetic domain wall

What is claimed is:

1. A magnetoresistive effect element comprising:
a first ferromagnetic layer;
a second ferromagnetic layer; and
a non-magnetic layer located between the first ferromagnetic layer and the second ferromagnetic layer,
wherein a crystal structure of the non-magnetic layer is a spinel structure,
wherein the non-magnetic layer contains Mg, Al, X, and O as elements constituting the spinel structure,
wherein the X is at least one or more elements selected from a group consisting of Ti, Pt, and W,
wherein a crystal structure of the non-magnetic layer is a reverse spinel structure, and
wherein a crystal space group is Imma or $P4_122$.

2. The magnetoresistive effect element according to claim 1,
wherein the element represented by the X is located at an A site or a B site of the spinel structure.

3. The magnetoresistive effect element according to claim 1,
wherein the non-magnetic layer has a concentration distribution of the X in a lamination direction.

4. The magnetoresistive effect element according to claim 3,
wherein a concentration of the X of at least one of a first surface on the side of the first ferromagnetic layer in the non-magnetic layer and a second surface on the side opposite to the first surface is higher than an average concentration of the X of the non-magnetic layer.

5. The magnetoresistive effect element according to claim 4,
wherein the concentration of the X of both the first surface and the second surface is higher than the average concentration of the X of the non-magnetic layer.

6. The magnetoresistive effect element according to claim 3,
wherein a concentration of the X of a second surface on the side of the second ferromagnetic layer is higher than an average concentration of the X of the non-magnetic layer.

7. The magnetoresistive effect element according to claim 1, further comprising:
an MgO layer located between the non-magnetic layer and the second ferromagnetic layer.

8. The magnetoresistive effect element according to claim 1, further comprising:
an Mg—Al—O layer located between the non-magnetic layer and the second ferromagnetic layer.

9. The magnetoresistive effect element according to claim 1, further comprising:
an MgO layer located between the non-magnetic layer and at least one of the first ferromagnetic layer and the second ferromagnetic layer.

10. The magnetoresistive effect element according to claim 1, further comprising:
an MgO layer located between the non-magnetic layer and at least one of the first ferromagnetic layer and the second ferromagnetic layer.

11. The magnetoresistive effect element according to claim 1,
wherein the X is Ti.

12. The magnetoresistive effect element according to claim 11,
wherein composition ratios x, y, and z of Mg, Al, and Ti with respect to a total amount of Mg, Al, and Ti of the non-magnetic layer are in a region surrounded by $1/12 \leq x \leq 11/12$, $0 \leq y \leq 7/12$, and $1/12 \leq z \leq 7/12$ in triangular coordinates using x, y, and z.

13. The magnetoresistive effect element according to claim 12, wherein the composition ratios x, y, and z of Mg, Al, and Ti with respect to the total amount of Mg, Al, and Ti of the non-magnetic layer are in a region excluding a region satisfying $x<7/12$ and $3/12<z$ in the region surrounded by $3/12 \leq x \leq 11/12$, $0 \leq y \leq 7/12$, and $1/12 \leq z \leq 5/12$ in the triangular coordinates using x, y, and z.

14. The magnetoresistive effect element according to claim 1,
wherein the X is Pt, and
wherein composition ratios x, y, and z of Mg, Al, and Pt with respect to a total amount of Mg, Al, and Pt of the non-magnetic layer are in a region surrounded by $1/12 \leq x \leq 11/12$, $0 \leq y \leq 7/12$, and $1/12 \leq z \leq 9/12$ in triangular coordinates using x, y, and z.

15. The magnetoresistive effect element according to claim 14,
wherein the composition ratios x, y, and z of Mg, Al, and Pt with respect to the total amount of Mg, Al, and Pt of the non-magnetic layer are in a region excluding a region satisfying $y<3/12$ and $5/12<x$ in the region surrounded by $1/12 \leq x \leq 11/12$, $0 \leq y \leq 7/12$, and $1/12 \leq z \leq 9/12$ in the triangular coordinates using x, y, and z.

16. A magnetoresistive effect element comprising:
a first ferromagnetic layer;
a second ferromagnetic layer; and
a non-magnetic layer located between the first ferromagnetic layer and the seam ferromagnetic layer,
wherein a crystal structure of the non-magnetic layer is a spinel structure,
wherein the non-magnetic layer contains Mg, Al, X, and O as elements constituting the spinel structure,
wherein the X is at least one or more elements selected from a group consisting of Ti, Pt, and W, and
wherein the concentration of the X at the center of the non-magnetic layer in a lamination direction is higher than the average concentration of the X of the non-magnetic layer.

17. The magnetoresistive effect element according to claim 16,
wherein a crystal structure of the non-magnetic layer is a reverse spinel structure, and
wherein a crystal space group is Imma or $P4_{1}22$.

18. A magnetoresisitive effect element comprising:
a first ferromagnetic layer;
a second ferromagnetic layer; and
non-magnetic layer located between the first ferromagnetic layer and the second ferromagnetic layer,
wherein a crystal structure of the non-magnetic layer is a spinel structure,
wherein the non-magnetic layer contains Mg, Al, X, and O as elements constituting the spinel structure, and
wherein the X is W.

19. The magnetoresistive effect element according to claim 18, wherein composition ratios x, y, and z of Mg, Al, and W with respect to a total amount of Mg, Al, and W of the non-magnetic layer are in a region surrounded by $1/12 \leq x \leq 11/12$, $0 \leq y \leq 9/12$, and $1/12 \leq z \leq 5/12$ in triangular coordinates using x, y, and z.

* * * * *